US009787288B2

(12) United States Patent
Mehrnia et al.

(10) Patent No.: US 9,787,288 B2
(45) Date of Patent: Oct. 10, 2017

(54) OPTIMAL FACTORING OF FIR FILTERS

(71) Applicant: Pentomics, Inc., Pasadena, CA (US)

(72) Inventors: Alireza Mehrnia, Pasadena, CA (US); Alan N. Willson, Jr., Pasadena, CA (US)

(73) Assignee: Alan N. Willson, Jr., Pasadena, CA (US)

( * ) Notice: Subject to any disclaimer, the term of this patent is extended or adjusted under 35 U.S.C. 154(b) by 0 days.

(21) Appl. No.: 15/206,642

(22) Filed: Jul. 11, 2016

(65) Prior Publication Data

US 2016/0322958 A1 Nov. 3, 2016

Related U.S. Application Data

(62) Division of application No. 14/626,292, filed on Feb. 19, 2015, now Pat. No. 9,391,591.

(60) Provisional application No. 61/941,966, filed on Feb. 19, 2014.

(51) Int. Cl.

| | |
|---|---|
| ***H03H 17/02*** | (2006.01) |
| ***H03H 17/06*** | (2006.01) |
| *H03H 17/00* | (2006.01) |

(52) U.S. Cl.

CPC ........ *H03H 17/0219* (2013.01); *H03H 17/06* (2013.01); *H03H 2017/0081* (2013.01); *H03H 2220/02* (2013.01)

(58) Field of Classification Search

CPC . H03H 17/0248; H03H 17/06; H03H 17/0219
See application file for complete search history.

(56) References Cited

U.S. PATENT DOCUMENTS

| | | | | |
|---|---|---|---|---|
| 4,802,222 A * | 1/1989 | Weaver | H03G 7/007 375/240 |
| 5,594,439 A * | 1/1997 | Swanson | H03M 1/1076 324/620 |
| 5,673,044 A * | 9/1997 | Pellon | H03H 17/04 341/143 |
| 2003/0187894 A1* | 10/2003 | Wang | H03H 17/0279 708/313 |
| 2014/0040339 A1* | 2/2014 | Abramovitch | H03H 17/0248 708/300 |

* cited by examiner

*Primary Examiner* — Chuong D Ngo
(74) *Attorney, Agent, or Firm* — Sterne, Kessler, Goldstein & Fox P.L.L.C.

(57) ABSTRACT

A method and system for the design and implementation of an optimally factored filter is presented. Pairs of angle values are organized in pairing candidates and a threshold is defined to indicate an upper bound on the number of pairing candidates. A first pairing candidate is exchanged above the threshold with a second pairing candidate below the threshold and a matrix is generated based on the pairing candidates below the threshold. A lowest predicted total quantization cost between all pairing candidates represented within the matrix is determined and the pairing candidates that result in the lowest predicted total quantization cost are used to determine the coefficients of the filter.

13 Claims, 23 Drawing Sheets

Target $\delta_p$ = 0.0839 (±0.7 dB)

Target $\delta_s$ = 0.0794 (−22 dB)

Target $\omega_p$ = 0.042 rad/π

Target $\omega_s$ = 0.14 rad/π

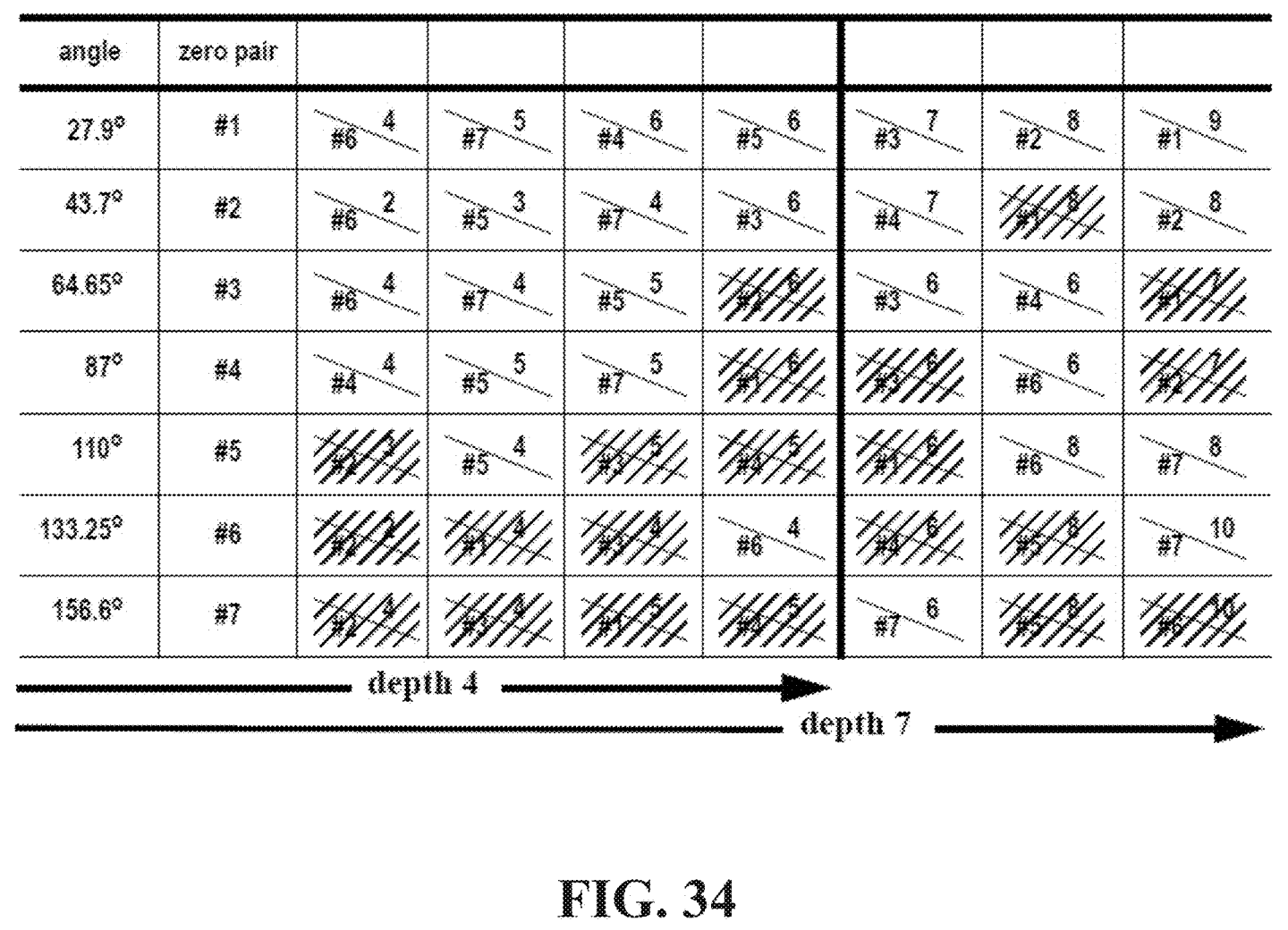

| angle | zero pair | | | | | | | |
|---|---|---|---|---|---|---|---|---|
| 27.9° | #1 | #6 / 4 | #7 / 5 | #4 / 6 | #5 / 6 | #3 / 7 | #2 / 8 | #1 / 9 |
| 43.7° | #2 | #6 / 2 | #5 / 3 | #7 / 4 | #3 / 6 | #4 / 7 | #1 / 8 | #2 / 8 |
| 64.65° | #3 | #6 / 4 | #7 / 4 | #5 / 5 | #1 / 6 | #3 / 6 | #4 / 6 | #1 / 7 |
| 87° | #4 | #4 / 4 | #5 / 5 | #7 / 5 | #1 / 6 | #3 / 6 | #6 / 6 | #2 / 7 |
| 110° | #5 | #2 / 5 | #5 / 4 | #3 / 5 | #4 / 5 | #1 / 6 | #6 / 8 | #7 / 8 |
| 133.25° | #6 | #2 / 2 | #1 / 4 | #3 / 4 | #6 / 4 | #4 / 6 | #5 / 8 | #7 / 10 |
| 156.6° | #7 | #2 / 4 | #3 / 5 | #1 / 5 | #4 / 5 | #7 / 6 | #5 / 8 | #6 / 10 |

depth 4 → depth 7 →

FIG. 34

| angle | zero pair | | | | | | | |
|---|---|---|---|---|---|---|---|---|
| 27.9° | #1 | #6 / 4 | #7 / 5 | #4 / 6 | #5 / 6 | #3 / 7 | #2 / 8 | #1 / 9 |
| 43.7° | #2 | #6 / 2 | #5 / 3 | #7 / 4 | #3 / 6 | #4 / 7 | ~~#1 / 9~~ | #2 / 8 |
| 64.65° | #3 | #6 / 4 | #7 / 4 | #5 / 5 | #4 / 6 | #3 / 6 | ~~#2 / 6~~ | ~~#1 / 7~~ |
| 87° | #4 | #4 / 4 | #5 / 5 | #7 / 5 | #6 / 6 | ~~#3 / 6~~ | ~~#1 / 6~~ | ~~#2 / 7~~ |
| 110° | #5 | ~~#2 / 3~~ | #5 / 4 | ~~#3 / 5~~ | ~~#4 / 5~~ | ~~#1 / 6~~ | #6 / 8 | #7 / 8 |
| 133.25° | #6 | ~~#2 / 2~~ | ~~#1 / 3~~ | ~~#3 / 3~~ | #6 / 4 | ~~#4 / 6~~ | ~~#5 / 8~~ | #7 / 10 |
| 156.6° | #7 | ~~#2 / 4~~ | ~~#3 / 4~~ | ~~#1 / 5~~ | ~~#4 / 5~~ | #7 / 6 | ~~#5 / 8~~ | ~~#6 / 10~~ |

depth 4 → depth 7 →

FIG. 35

OPTIMAL FACTORING OF FIR FILTERS

CROSS-REFERENCE TO RELATED APPLICATIONS

This patent application is a divisional of U.S. patent application Ser. No. 14/626,292, filed on Feb. 19, 2015, which claims the benefit of Provisional Patent Application No. 61/941,966, filed Feb. 19, 2014, the disclosures of which are incorporated herein by reference in their entireties.

FIELD

The invention relates generally to digital filters.

BACKGROUND

Finite impulse response (FIR) filters are commonly used digital filters. An FIR filter has an impulse response that settles to zero in a finite number of sample periods. FIR filters are inherently stable because FIR filters require no feedback and have their poles at the origin (within the unit circle of the complex z plane). However, all digital filters, including FIR filters, are sensitive to perturbations in the filter's tap coefficients.

A digital filter constructed as a cascade of two or more sub-filters can possess the capability of lowering the filter's sensitivity to these filter coefficient perturbations. This property is described in J. W. Adams and A. N. Willson, Jr., "A new approach to FIR digital filters with fewer multipliers and reduced sensitivity," *IEEE Trans. Circuits Syst.*, vol. CAS-30, pp. 277-283, May 1983 [referred to herein as "Adams"] which is herein incorporated by reference in its entirety.

A crucial capability for building such filters concerns finding the best FIR filter factors, then carefully scaling and sequencing them. The efficiency of the resulting structure depends heavily upon obtaining such optimal factors.

SUMMARY

According to an embodiment, a filter designed to receive an input signal and generate an output signal includes a plurality of first stages, where each stage of the plurality of first stages has an order of four or greater, and one or more second stages each having an order less than four. The plurality of first stages and the one or more second stages are coupled together in cascade. A total order of the plurality of first stages is higher than a total order of the one or more second stages.

According to an embodiment, a method of determining factors of a filter includes organizing pairings of angle values into pairing candidates and defining a threshold to indicate an upper bound on the number of pairing candidates. The method also includes exchanging a first pairing candidate above the threshold with a second pairing candidate below the threshold and generating a matrix based on the pairing candidates below the threshold. The method then determines a lowest predicted total quantization cost between all pairing candidates represented within the matrix and uses the pairing candidates that result in the lowest predicted total quantization cost to determine the coefficients of the filter.

According to an embodiment, a method for determining a sequence of a plurality of stages of a filter includes determining a sum of squared coefficient values for each stage of the plurality of stages of the filter and arranging the plurality of stages of the filter in cascade. The arrangement is performed such that a first stage position in the cascade includes a stage having a lowest sum of squared coefficient values among each stage of the plurality of stages, and a subsequent stage position includes another stage of the plurality of stages, such that a partial filter comprising the another stage and each previous stage in the cascade has a lowest sum of squared coefficient values among the possible stages to choose for the another stage.

BRIEF DESCRIPTION OF THE DRAWINGS/FIGURES

FIG. 34 illustrates a table having sorted entries on rows from Table 1, according to an embodiment.

FIG. 35 illustrates a table having slight rearrangement of row elements from the table in FIG. 34, according to an embodiment.

Figure 1:
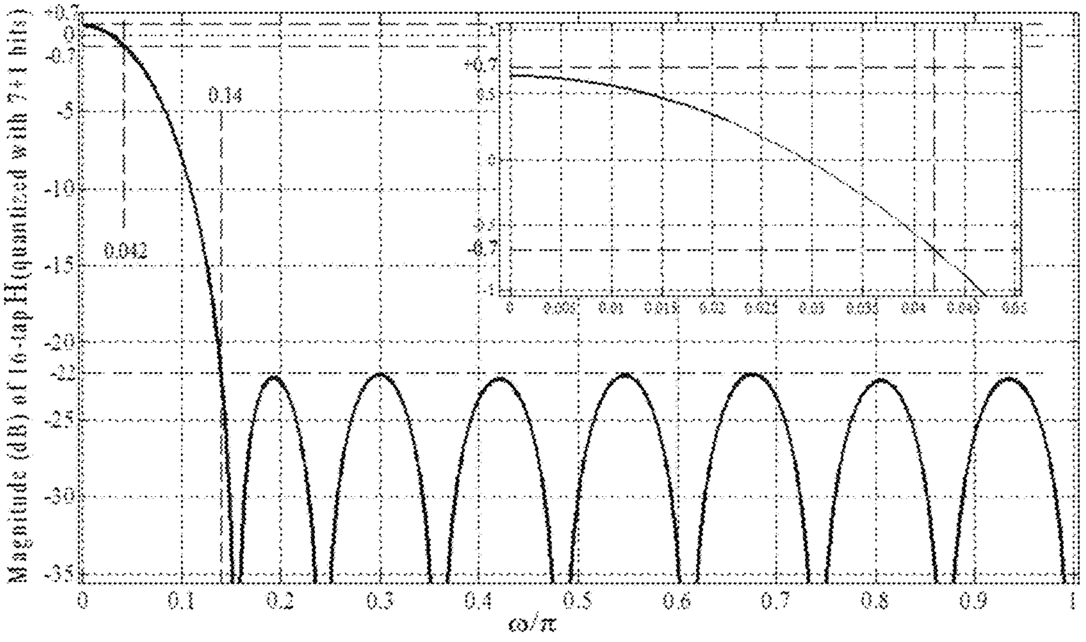
FIG. 1 depicts a zero plot for an example order-15 narrow-band low-pass filter.
Figure 1:
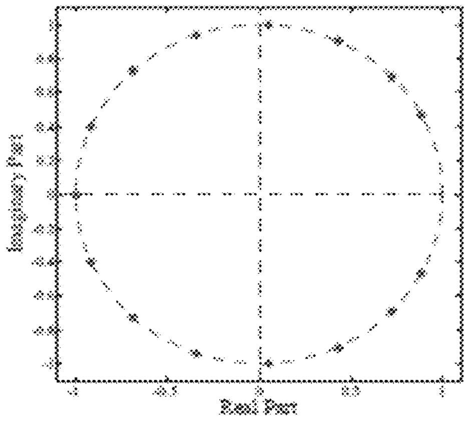

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it is submitted that it is within the knowledge of one skilled in the art to affect such feature, structure, or characteristic in connection with other embodiments whether or not explicitly described.

Other embodiments are possible, and modifications may be made to the embodiments within the spirit and scope of the invention. Therefore, the detailed description is not meant to limit the invention. Rather, the scope of the invention is defined by the appended claims.

I. OVERVIEW

A digital filter has a z-domain transfer function H(z) that is a rational function of the complex variable z. For linear-phase FIR filters, the transfer function is usually put into the form of a polynomial in the variable $z^{-1}$ having real coefficients. Moreover, due to the linear-phase feature, the polynomial coefficients exhibit either even or odd symmetry—e.g., $H(z)=a+bz^{-1}+az^{-2}$ is a filter of even order (implying an odd-length coefficient sequence) and even symmetry, while $H(z)=a+bz^{-1}-bz^{-2}-az^{-3}$ is an example of a filter of odd order (hence, an even length coefficient sequence) and odd symmetry. The odd-symmetry case provides polynomials for which H(z) has a zero at dc (i.e., at z=1) and this would prohibit H(z) from being a low-pass filter. Since our focus here will be on low-pass filters, we shall require an Nth-order filter H(z) to have one of the forms given in either Equation (1a) or (1b).

$$H(z) = h_{N/2} + h_{N/2-1}z^{-1} + \ldots + h_1z^{-(N/2-1)} + h_0z^{-N/2} + h_1z^{-(N/2+1)} + \ldots + h_{N/2-1}z^{-(N-1)} + h_{N/2}z^{-N},\ N \text{ even} \quad (1a)$$

$$H(z) = h_{(N+1)/2} + h_{(N-1)/2}z^{-1} + \ldots + h_1z^{-(N-1)/2} + h_1z^{-(N+1)/2} + \ldots + h_{(N-1)/2}z^{-(N-1)} + h_{(N+1)/2}z^{-N},\ N \text{ odd} \quad (1b)$$

Figure 2:
FIG. 2 depicts an example cascade form (minimum order factors).

FIG. 1 shows the 15 zeros of an example type (1b) filter. This filter has a narrow pass-band and its complex zeros appear in conjugate pairs on the unit circle. One choice of factors for such a filter uses the 1st-order real, and natural 2nd-order zero-pairings as factors. A factor is a polynomial component of a filter's transfer function. Such simple minimum-order factors yield the structure shown in FIG. 2—a basic "natural" factorization.

The k-th 2nd-order complex-conjugate-pair factor of H(z) is given below in Equation (2).

$$H_k(z)=(e^{j\theta_k}-z^{-1})(e^{-j\theta_k}-z^{-1})=1-(2\cos\theta_k)z^{-1}+z^{-2}. \quad (2)$$

Notice that each such 2nd-order factor has just one non-trivial coefficient: $-2\cos(\theta_k)$. Such factors as shown in Equation (2) have non-unity dc gains, which is another issue that will be discussed later.

One may also create 4th-order factors for the FIG. 1 filter by combining two 2nd-order factors, which yields two non-trivial coefficients (3) for the 4th-order factor:

$$\begin{aligned} H_p(z)H_q(z) &= (1-(2\cos\theta_p)z^{-1}+z^{-2})(1-(2\cos\theta_q)z^{-1}+z^{-2}) \\ &= 1-2(\cos\theta_p+\cos\theta_q)z^{-1}+2(1+2\cos\theta_p\cos\theta_q)z^{-2} - 2(\cos\theta_p+\cos\theta_q)z^{-3}+z^{-4} \end{aligned} \quad (3)$$

$$\text{First non-trivial coefficient} = -2(\cos\theta_p+\cos\theta_q)$$

$$\text{Second non-trivial coefficient} = 2(1+\cos\theta_p\cos\theta_q).$$

An advantage to doing this combining is that the implementation of the coefficients as shown in Equation (3) could be cheaper than the implementation of two of the corresponding nontrivial coefficients shown in Equation (2). Moreover, there can be many possible pairings of 2nd-order factors, hence many possibilities that a resulting pair of coefficients (3) could be particularly desirable. Let us elaborate on this point by using the example filter of FIG. 1. In this filter there are seven 2nd-order factors for which as many as six can be selected for pairing into three 4th-order factors. It can be shown that for N 2nd-order factors, where N is even, there are 1×3× . . . ×(N−1) different pairings of these N $2^{nd}$-order factors. Thus, given six such factors (N=6), in this example, there are 3×15=15 different pairings. These 15 pairings are based upon one specific 2nd-order factor that is left unpaired. Therefore, there are 7×15=105 different ways that one can choose one 2nd-order factor to remain unpaired and then pair the remaining factors. This number is small enough that it would be feasible to exhaustively explore all possibilities to find the best result as would be understood by one of ordinary skill in the art.

However, one may consider an alternative selection of three 2nd-order factors to remain unpaired, which can be done in 7!/(3!×4!)=5×6×7/(2×3)=35 ways. And, by pairing the remaining four 2nd-order factors to make two 4th-order factors, one obtains 3×35=105 additional results. Finally, if one were to select five $2^{nd}$-order factors to remain unpaired, which can happen in 7!/(5!×2!)=6×7/2=21 different ways, and pair the two remaining $2^{nd}$-order factors to make a single 4th-order factor, we would have 21 additional different results. By adding these result totals to the one simple option of keeping all seven 2nd-order factors unpaired, we have 105+105+21+1=232 different results.

One can perform an exhaustive search of all 232 possible pairings in this example and find the following optimal pairings (2nd-order pair k is identified by its angle $\theta_k$):

a. pair #1 (27.9° &133.25°) coeffs.: −0.39774 −0.42269 b. pair #2 (43.7° &110°) coeffs.: −0.76312 1.0131 c. pair #3 (64.65° &156.6°) coeffs.: 0.97875 0.4284 d. leave #4 (87°) unpaired. coeffs.: −0.10386

When multiplications are performed by using hard-wired shifts and additions this best (e.g., optimal pairing) solution requires as few as eight additions, depending on whether or not certain sub-expression reuse is employed. This is less than alternative implementations, and this cost includes the implementation of a post-filter compensation multiplier 302 (with binary coefficient value 0.111 shown at the filter output in FIG. 3). Scaling is an important topic that shall subsequently be discussed. It (and the closely-related topic of sub-stage sequencing) is the reason for the several (hard-wired shift) scaling multipliers 304 of value $2^0$ and $2^{-1}$ along the top of FIG. 3, according to an embodiment. These scaling multipliers may be configured to shift a number of bits associated with the received input signal to the right if the factor of two is less than 1, and to shift the number of bits associated with the received input single to the left if the factor of two is greater than 1. In an embodiment, the values of these scaling multipliers are chosen to bring a DC gain of the received input signal closer to 1. The downward-pointing arrows that follow denote truncation of least significant bits (LSBs.) The stages have been named $H_1$ (a 1st-order stage), . . . , $H_5$. In an embodiment, each stage of the cascaded filter includes at least two multipliers. The order of each stage (or factor) may be determined by the number of delay elements ($z^{-1}$) within each stage.

Figure 3:
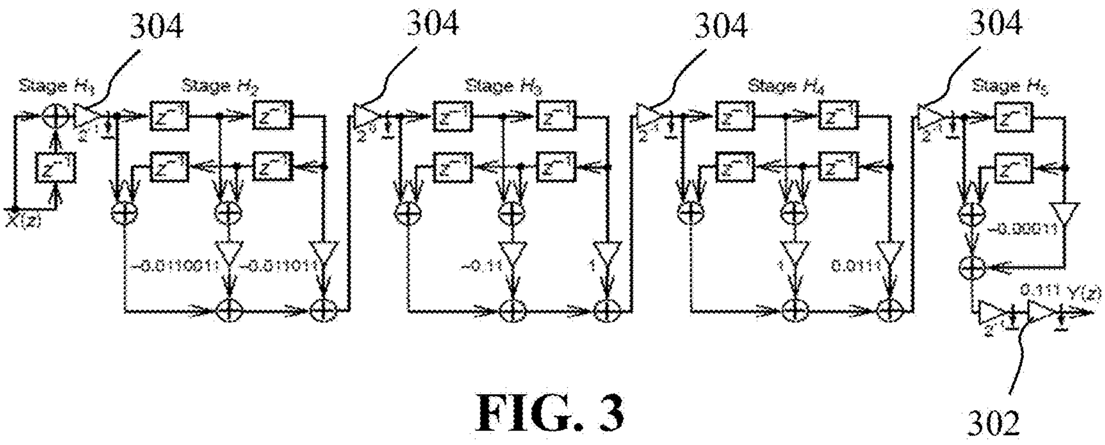
FIG. 3 depicts an FIR filter cascade, according to an embodiment.
Figure 4:
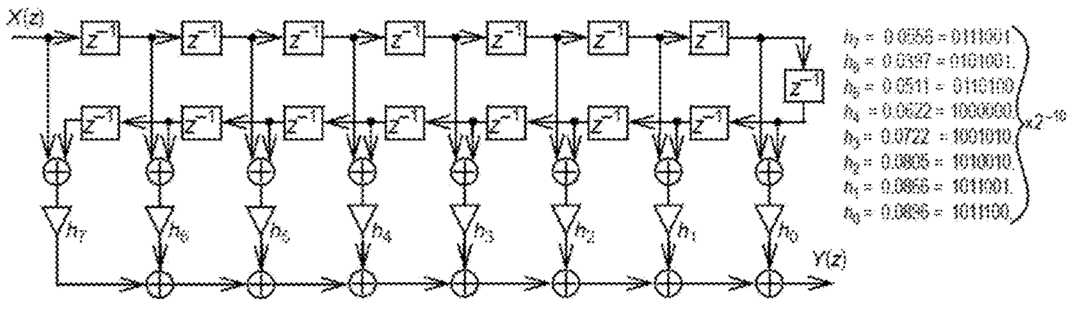
FIG. 4 depicts an example direct-form implementation of an order-15 FIR filter.
Figure 5:
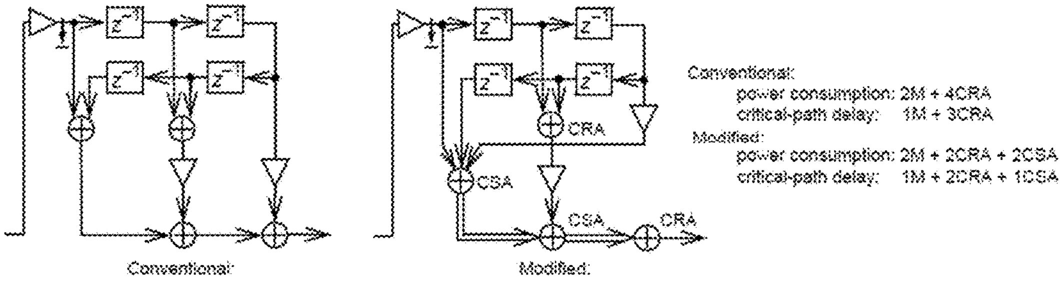
FIG. 5 depicts the use of carry-save adders in the $4^{th}$ order factors.

As a reference point for assessing the implementation cost savings, one may use the conventional direct-form FIR implementation of the example 16-tap filter illustrated in FIG. 4. The multiplications from this filter require at least 15 additions. Both implementations from FIG. 3 and FIG. 4 require 15 delay elements (i.e., blocks) and 15 structural adders. However, the 4th-order stages (e.g., $H_2$, $H_3$, and $H_4$) in the FIG. 3 structure may be organized such that they accommodate carry-save structural adders, as shown in FIG. 5, which can yield modest increases in the filter's operating speed and/or modest reductions in its power consumption.

Figure 6:
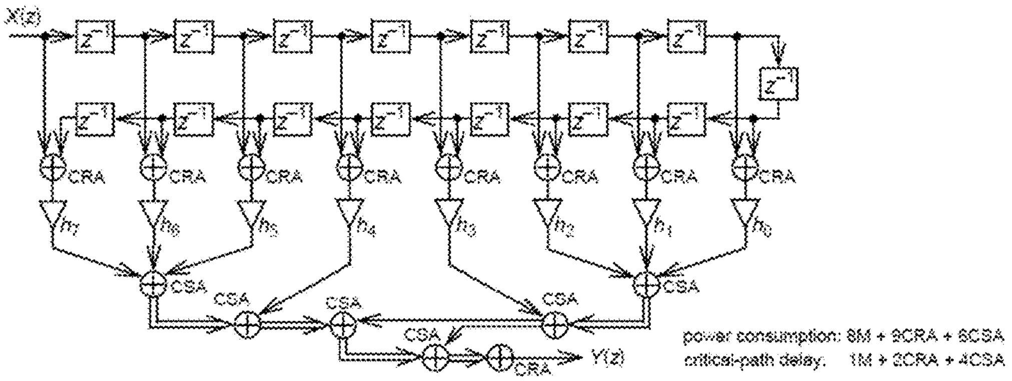
FIG. 6 depicts the use of carry-save adders in an example direct-form implementation of an order-15 FIR filter.

Hard-wired shifts and additions have been mentioned as an implementation method and the number of such additions may be used as a measure of implementation cost. Another issue when comparing implementation costs is the issue of data-path word-length. It is quite possible that, as the input data flows through a filter structure, it may be necessary for the word-length to grow. This matter can be closely related to the amount of round-off noise that a system introduces. In the case of the example system just discussed with reference to FIG. 3, it can be shown that the optimally factored implementation of this filter system requires no growth in data-path word-length. We also observe (in FIG. 6) that, while the direct-form FIR filter can also benefit from the use of carry-save adders, its power consumption (also given in FIG. 6) can still exceed that of the FIG. 3 filter. Thus, it is evident that the performance of the optimally-factored FIR filter (as illustrated in FIG. 3) has the potential to surpass that of the direct-form structure, both in terms of speed and power consumption. This performance edge is especially enhanced by the fact that the conventional direct-form structure can tend to require adders of greater bit-width (than those employed by the optimally factored FIR filter) in performing the additions at the bottom of FIG. 4 or FIG. 6. Also, the notion of pipelining these additions for high-speed operation can become a severe power-consumption drawback for the conventional direct-form FIR filter. Although FIG. 3 illustrates an example FIR filter, the methods and structures described herein may also be applied to an IIR filter, or any other type of digital or analog filter. According to an embodiment, the optimally factored filter illustrated in FIG. 3 includes a plurality of filters each having an order of four or greater, as well as one or more filters each having an order less than four. In this example, stages H2, H3, and H4 each have an order of four, while stage H1 and stage H5 have orders of one and two, respectively. A total order of the plurality of first stages (12 in this example) is higher than a total order of the one or more second stages (3 in this example). In another embodiment, none of the stages within the plurality of first stages are identical to one another.

A clear advantage that the optimally factored-FIR filter possesses is that it can very easily be pipelined so as to increase its maximum operating speed. Consider the example multi-factor structure of FIG. 3 and envision its relatively long critical path, which is emphasized in FIG. 7. It is evident that, for sufficiently high-order filters, this delay-free path will become the overall structure's critical path. Its length can set the filter's maximum operating speed, and this applies whether or not the stages employ carry-save adders in the manner illustrated in FIG. 5. The conventional direct-form FIR filter of either FIG. 4 or FIG. 6 will also encounter such difficulties when high-speed operation is desired. The traditional remedy for such speed-limiting problems is to introduce some form of pipelining into the system.

Figure 7:
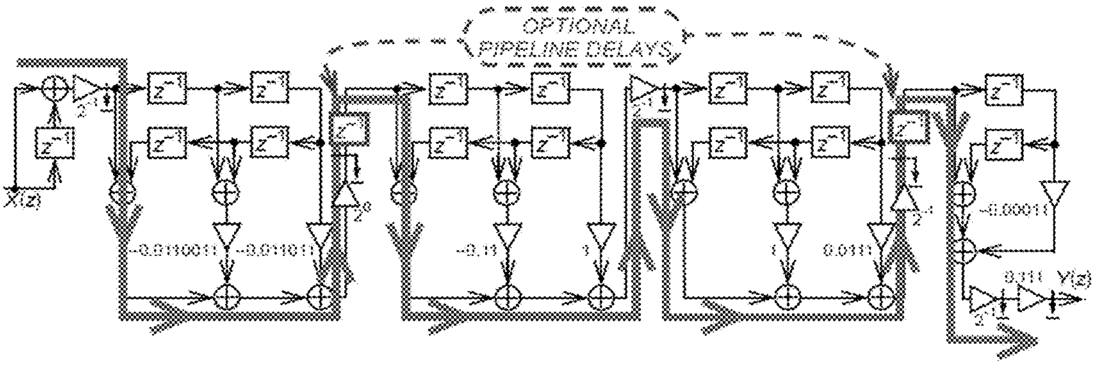
FIG. 7 depicts a critical path in an FIR filter cascade, according to an embodiment.

In the case of the optimally factored FIR filter, FIG. 7 shows an example of how, by inserting two delay blocks ($z^{-1}$) into the FIG. 7 structure, the critical path delay is reduced to that of just two 4th-order stages, according to an embodiment. In another example, registers may be used in place of the two delay blocks ($z^{-1}$). The delay blocks or registers may be considered to be examples of pipelining buffers. The number of such insertions and their locations may be determined so as to create a system having the minimum number of pipelining registers that provide a desired high operating speed. The pipelining of the conventional direct-form FIR filters tends to be much more difficult and hardware-costly in comparison to their optimally-factored FIR counterparts.

As noted above, the performance of the optimally-factored FIR filter has the potential to surpass the direct-form structure both in terms of speed and power consumption. The next section will discuss how optimal factors may be obtained.

II. SETTING UP THE ALGORITHM

According to an embodiment, the method for determining optimal FIR filter factors begins by obtaining a rough indication of the qualities of the $4^{th}$-order transfer function factors that can be made from two $2^{nd}$-order factors. Here, the 2nd-order factors may be associated with the complex-conjugate stop-band zeros of the sort shown in FIG. 1, but 2nd-order factors obtained from reciprocally-valued real zeros may also be included and may be present in a low-pass FIR filter's transfer function. For such factors we have a transfer function as shown below in equation (4):

$$H_k(z)=(a-z^{-1})(a^{-1}-z^{-1})=1-(a+a^{-1})z^{-1}+z^{-2} \quad (4)$$

Figure 8:
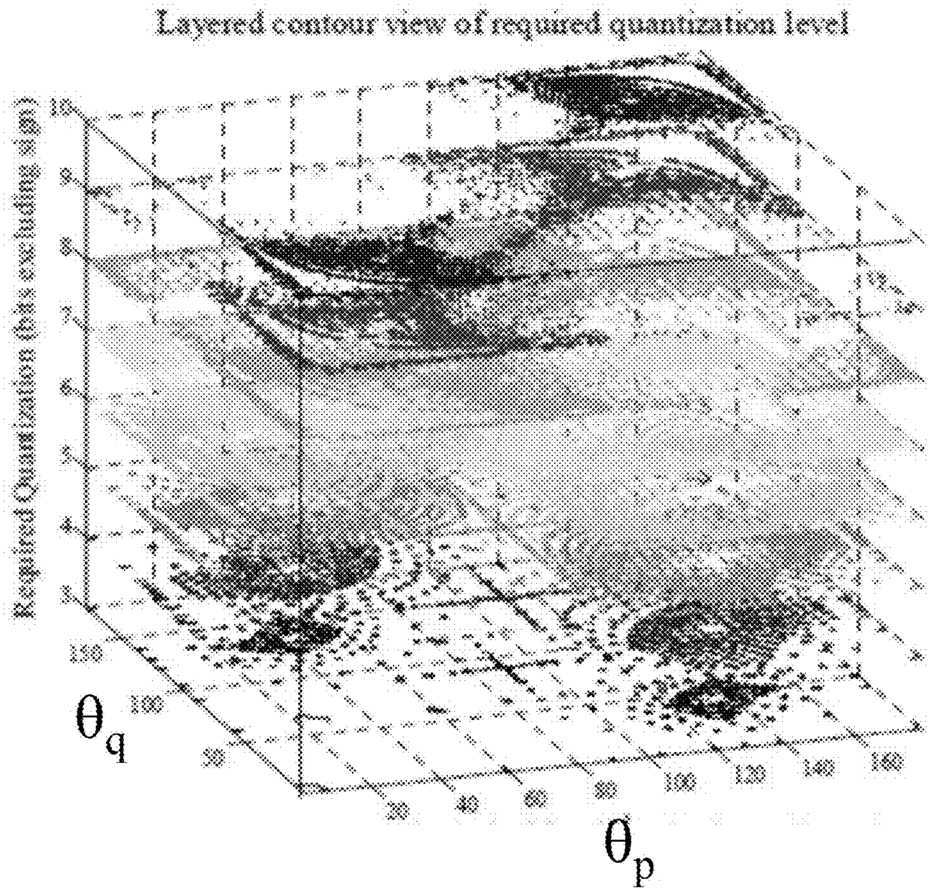
FIG. 8 depicts a graph showing the required quantization level for a resulting $4^{th}$ order factor.

FIG. 8 illustrates the approximate required quantization level (i.e., the number of bits, excluding the sign bit) that would be needed to represent the resulting 4th-order-factor coefficients when pairing two 2nd-order factors having angles $\theta_p$ and $\theta_q$ represented as points on the x and y axes, respectively. (Angle values are given in degrees, with 0.5° resolution.) The determined values for $\theta_p$ and $\theta_q$ may be used to determine the filter coefficients for each stage as shown in Equation (3). While the plot shows that there are various special angles for which different results apply, several general features include: (1) The plot is invariant to an exchange of the x and y axes; (2) the upper-left and lower-right quadrants [one angle large, one small] tend to provide low quantization sensitivity levels; (3) the upper-right and lower-left corners [both angles large or both small] tend to yield high sensitivity quantization levels; and (4) there is a thin "border" around the entire plot for which rather low sensitivity results tend to occur. This would seem to correspond to one (or both) angles being close to 0° or 180°, and similarly for many angle-pairs where one angle (or both) are close to 60°, 90°, or 120°. Further details regarding the approximate required quantization levels with angles $\theta_p$ and $\theta_q$ can be found in A. Mehrnia and A. N. Willson, Jr., "Optimal factoring of FIR filters," *IEEE Transactions on Signal Processing*, vol. 63, no. 3, pp. 647-661, Feb. 1, 2015.

One may create several examples that illustrate some of the tendencies predicted by FIG. 8. The first example considers pairing two 2nd-order factors with angles of $\theta_p=48°$ and $\theta_q=138°$; this results in a very low sensitivity level for the non-trivial coefficients of this 4th-order factor. Indeed, a mere 3-bit quantization level yields a frequency response with negligible error. Alternatively, when pairing two 2nd-order factors having angles $\theta_p=45°$ and $\theta_q=63°$, a much higher sensitivity level results; these 4th-order-factor coefficients require 8+1 bits. Finally, the importance of the FIG. 8 sensitivity assessments is further highlighted when considering that, according to FIG. 8, the pairing of $\theta_p=13°$ and $\theta_q=20°$, should require more than 11 bits.

We are beginning to discuss a search algorithm whose goal is to find optimal factors for a given low-pass FIR transfer function. Unlike some of the examples discussed in the Overview, it is usually very difficult to exhaustively search through all of the possible choices for getting good factors. This is because the number of choices can become quite large. Consider the general situation with a narrow-band low-pass filter for which there are N/2 zero pairs that can be candidates for achieving a set of best-matched pairs (4th-order factors). It can be shown that the number of distinct ways that one can pair together N/2 2nd-order factors into N/4 4th-order factors is:

$$\left(\frac{N}{2}-1\right)\left(\frac{N}{2}-3\right)\left(\frac{N}{2}-5\right)\ldots 5\times 3\times 1 \quad (5)$$

For each of these possible pairings, a 1-bit, 2-bit, . . . , to as large as perhaps 32-bit quantization of the factor coefficients may need examination for each resulting set of N/4 4th-order factors (each with as many as two non-trivial coefficients). Neglecting that there are additional cases to be considered, i.e., finding those 2nd-order factors that are better left uncombined, and assuming that, on average, ten quantization possibilities per factor must be examined (out of the various 1-bit to 32-bit quantization possibilities per factor), this would represent a total of at least:

$$10\left(\frac{N}{4}\right)\left(\frac{N}{2}-1\right)\left(\frac{N}{2}-3\right)\left(\frac{N}{2}-5\right)\ldots 5\times 3\times 1 \text{ cases} \quad (6)$$

To provide some insight into the size of this number, for N=52, this number exceeds $10^{15}$, and for N=36, it exceeds 3 billion. Smaller values of N provide more encouraging realities: for N=24 it is 623,700 and for N=12 it is 450. This, unfortunately, indicates that an impractical level of complexity may be at hand if one is considering an exhaustive examination of all pairing possibilities. While the previous example of an order-15 transfer function may have left the impression that an exhaustive search is feasible, commonly used filter sizes can often be too large for this.

Figure 9:
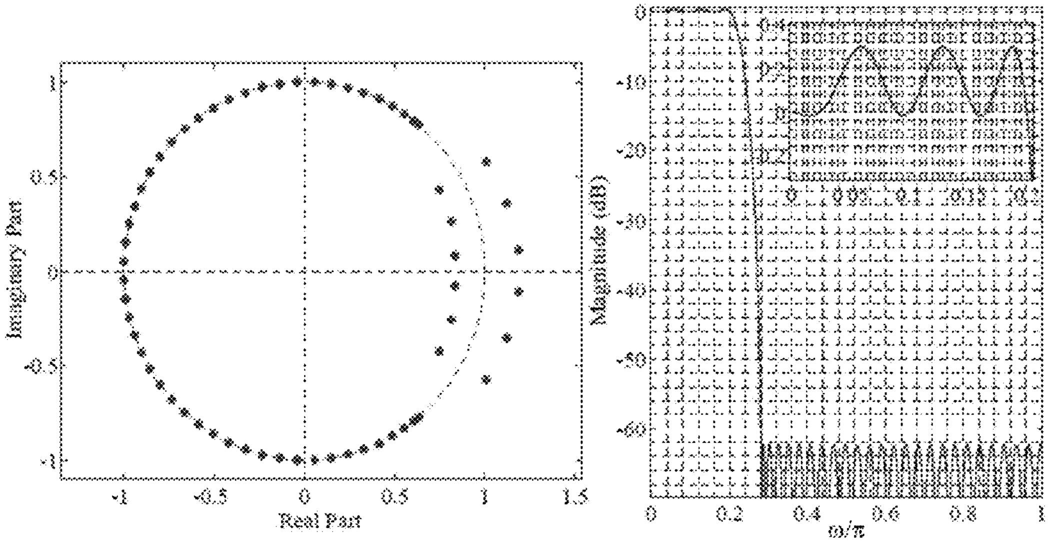
FIG. 9 depicts a zero-map and frequency response of an example 63-tap filter having three 4th-order groups of pass-band zeros.

The data illustrated in FIG. 8 may be used to predict the required quantization levels for the 4th-order factors that result from the pairing of any two 2nd-order H(z) factors whose roots lie on the unit circle in the z-plane, according to an embodiment. The information from which FIG. 8 was created is contained in a table (a "coarse quantization cost matrix") that is used by the FIR filter optimal-factoring algorithm to get a good starting point for its processing. Getting a good start this way can help to reduce the computational complexity to a more practical range. As mentioned, the data in this table are indexed by approximations to angles $\theta_p$ and $\theta_q$ that have a 0.5° precision. A similar approach is applicable for the case of pass-band zeros that lie off the unit circle, typically being associated with pass-band ripples, as shown in FIG. 9, which displays three groups of four such zeros, each group being described by a 4th-order polynomial factor taking the form:

$$\begin{aligned}H_k(z) &= (r_k e^{j\theta_k} - z^{-1})(r_k e^{-j\theta_k} - z^{-1}) \\ &\quad (r_k^{-1} e^{-j\theta_k} - z^{-1})(r_k^{-1} e^{j\theta_k} - z^{-1}) \\ &= (r_k^2 - (2r_k \cos\theta_k)z^{-1} + z^{-2})(r_k^{-2} - (2r_k^{-1}\cos\theta_k)z^{-1} + z^{-2}) \\ &= 1 - 2(r_k + r_k^{-1})\cos\theta_k z^{-1} + (r_k^2 + r_k^{-2} + 4\cos^2\theta_k)z^{-2} - \\ &\quad 2(r_k + r_k^{-1})\cos\theta_k z^{-3} + z^{-4}\end{aligned} \quad (7)$$

First non-trivial coefficient $= -2(r_k + r_k^{-1})\cos\theta_k$

Second non-trivial coefficient $= r_k^2 + r_k^{-2} + 4\cos^2\theta_k$.

Even when such zeros exist, we shall tend to focus on pairing the 2nd-order unit-circle-zero factors.

III. DYNAMIC SEARCH ALGORITHM

With regards to the 16-tap filter example of FIG. 1, Table 1 below shows the estimated quantization cost of the various pairings of the filter's seven 2nd-order factors, according to an embodiment. Since we would not pair one of these factors with itself, the entries on the main diagonal in Table 1 are understood to represent the cost for leaving each pair alone.

TABLE 1

Course Quantization - Number of bits needed for all pairs

| angle | zero pair | 27.9° #1 | 43.7° #2 | 64.65° #3 | 87° #4 | 110° #5 | 133.25° #6 | 156.6° #7 |
|---|---|---|---|---|---|---|---|---|
| 27.9° | #1 | 9 | 8 | 7 | 6 | 6 | 4 | 5 |
| 43.7° | #2 | 8 | 8 | 6 | 7 | 3 | 2 | 4 |
| 64.65° | #3 | 7 | 6 | 6 | 6 | 5 | 4 | 4 |
| 87° | #4 | 6 | 7 | 6 | 4 | 5 | 6 | 5 |

TABLE 1-continued

| Course Quantization - Number of bits needed for all pairs | | | | | | | | |
|---|---|---|---|---|---|---|---|---|
| angle | zero pair | 27.9° #1 | 43.7° #2 | 64.65° #3 | 87° #4 | 110° #5 | 133.25° #6 | 156.6° #7 |
| 110° | #5 | 6 | 3 | 5 | 5 | 4 | 8 | 8 |
| 133.25° | #6 | 4 | 2 | 4 | 6 | 8 | 4 | 10 |
| 156.6° | #7 | 5 | 4 | 4 | 5 | 8 | 10 | 6 |

Also, since pairing, for example, zero-pair #1 with zero-pair #2 is the same as pairing zero-pair #2 with zero-pair #1, the cost entries in Table 1 would always constitute a symmetric matrix and would therefore contain redundant information.

According to an embodiment, Table 1 is reorganized by sorting each row in ascending order of cost. This will ruin the matrix symmetry, so each row entry is accompanied with the column-name from which it originally came. This yields the result shown in FIG. 34, for which each entry has a cost, above the cell's diagonal line, and the original column number below (where #k denotes column k).

The cells that represent redundant information have been indicated by crosshatching (these are data that originated in cells below the main diagonal of Table 1). The first element of the fifth row of the table in FIG. 34 shows that pairing the 2nd-order factor #5 with the 2nd-order factor #2 results in a 4th-order factor with two non-trivial coefficients, as in Equation (3), that require an estimated three bits, that is 3+1, including a sign bit. Notice that this cell of the table in FIG. 34 is one of the redundant cells—its information is already provided by the second entry in row 2.

As noted in FIG. 34, zero-pair #3 may be paired with either #6 or #7 to result in the lowest approximate quantization cost. Also, 2nd-order factor #4 is observed to require the least quantization cost when it is not paired. These tentative conclusions are based on the initial coarse quantization cost matrix and hence the algorithm will need to examine these attractive pairing choices more precisely in its next phases.

crosshatched cell (#2\6) on row 3 of the table can be exchanged with an uncrosshatched cell (#4\6) while not increasing the cost (both have 6 as the cost) and that will give one additional pairing option while keeping the depth-4 setting. Similarly, cells #1\6 and #6\6 can be exchanged on row 4. These exchanges are incorporated into the table of FIG. 35. Even beyond this alteration, the algorithm will, in fact, always include any non-redundant cell that has a cost not greater than the highest cost appearing to the left of the depth barrier.

Figure 10:
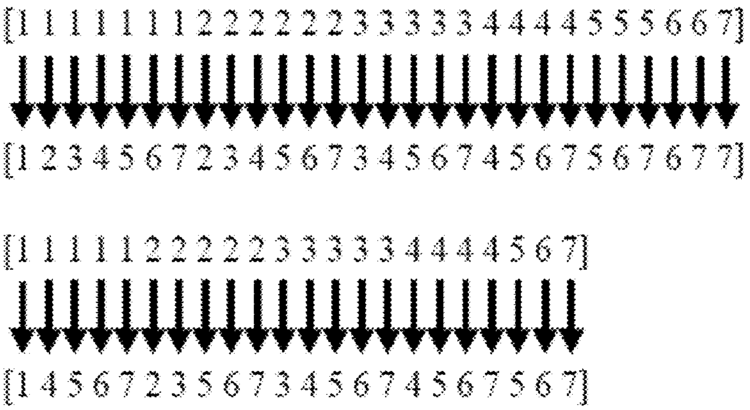
FIG. 10 depicts example origin & destination vectors.

With the depth-4 pairings identified in the table in FIG. 35 expressed as origin and destination nodes above and below the arrows in FIG. 10, a binary connection matrix (shown below in Table 2) may be created that contains the feasible flow information (allowed pairings) allowing for the determination of a binary flow (solution) vector x that will indicate the optimal pairings, according to an embodiment. This information can be put into matrix and vector form as Ax, where, for the depth-4 choice of the present example, the vector x is a length-22 vector containing only binary (0 and 1) entries and the 7×22 matrix A, given in equation (8), conveys the information of Table 2.

TABLE 2

| Binary Connection Matrix (Feasible Pairings) depth = 4 | | | | | | | | | | | | | | | | | | | | | | |
|---|---|---|---|---|---|---|---|---|---|---|---|---|---|---|---|---|---|---|---|---|---|---|
| | origin vector | | | | | | | | | | | | | | | | | | | | | |
| | 1 | 1 | 1 | 1 | 1 | 2 | 2 | 2 | 2 | 2 | 3 | 3 | 3 | 3 | 3 | 4 | 4 | 4 | 4 | 5 | 6 | 7 |
| | destination vector | | | | | | | | | | | | | | | | | | | | | |
| | 1 | 4 | 5 | 6 | 7 | 2 | 3 | 5 | 6 | 7 | 3 | 4 | 5 | 6 | 7 | 4 | 5 | 6 | 7 | 5 | 6 | 7 |
| #1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| #2 | 0 | 0 | 0 | 0 | 0 | 1 | 1 | 1 | 1 | 1 | 0 | 0 | 0 | 0 | 0 | 0 | 0 | 0 | 0 | 0 | 0 | 0 |
| #3 | 0 | 0 | 0 | 0 | 0 | 0 | 1 | 0 | 0 | 0 | 1 | 1 | 1 | 1 | 1 | 0 | 0 | 0 | 0 | 0 | 0 | 0 |
| #4 | 0 | 1 | 0 | 0 | 0 | 0 | 0 | 0 | 0 | 0 | 0 | 1 | 0 | 0 | 0 | 1 | 1 | 1 | 1 | 0 | 0 | 0 |
| #5 | 0 | 0 | 1 | 0 | 0 | 0 | 0 | 1 | 0 | 0 | 0 | 0 | 1 | 0 | 0 | 0 | 1 | 0 | 0 | 1 | 0 | 0 |
| #6 | 0 | 0 | 0 | 1 | 0 | 0 | 0 | 0 | 1 | 0 | 0 | 0 | 0 | 1 | 0 | 0 | 0 | 1 | 0 | 0 | 1 | 0 |
| #7 | 0 | 0 | 0 | 0 | 1 | 0 | 0 | 0 | 0 | 1 | 0 | 0 | 0 | 0 | 1 | 0 | 0 | 0 | 1 | 0 | 0 | 1 |

$$A = \begin{bmatrix} 1&1&1&1&1&0&0&0&0&0&0&0&0&0&0&0&0&0&0&0&0&0 \\ 0&0&0&0&0&1&1&1&1&1&0&0&0&0&0&0&0&0&0&0&0&0 \\ 0&0&0&0&0&0&1&0&0&0&1&1&1&1&1&0&0&0&0&0&0&0 \\ 0&1&0&0&0&0&0&0&0&0&0&1&0&0&0&1&1&1&1&0&0&0 \\ 0&0&1&0&0&0&0&1&0&0&0&0&1&0&0&0&1&0&0&1&0&0 \\ 0&0&0&1&0&0&0&0&1&0&0&0&0&1&0&0&0&1&0&0&1&0 \\ 0&0&0&0&1&0&0&0&0&1&0&0&0&0&1&0&0&0&1&0&0&1 \end{bmatrix} \tag{8}$$

As shown in the table of FIG. 35, a "depth" parameter can also be defined; it indicates an upper bound on the number of potential pairing candidates that will be considered for all rows. For instance, a depth value of four indicates that at most the first four candidates in each row of the sorted coarse quantization cost matrix will be considered during the rest of the optimization process. (In addition, all self-pairing possibilities will always be considered, as indicated in FIG. 10 by the presence of a path from node #k to node #k, for all k.) While such a depth parameter may seem unnecessary for smaller filters with limited numbers of zero pairs, it represents an efficient, virtually essential simplifying procedure when dealing with very large filters.

According to an embodiment, one more alteration to the table of FIG. 34 addresses the fact that, for example, a The vector x may be determined such that Ax=b holds, where vector b has length 7 with all "1" elements. Since each column in matrix A represents a specific zero pairing, the length-22 vector x will have at-most seven "1" entries and the rest will be "0." That is, x will select up to seven columns of A and, since each column in this selection will represent a pairing of two 2nd-order factors (or it will represent the choice that a factor will remain unpaired), for each row of A there will be exactly one selected column that has a non-zero value on that row. It is the algorithm's task to determine the vector x that specifies the optimal choice of these columns, according to an embodiment.

Binary Integer Programming provides one example tool to use in solving problems specified in the following form: Find the binary vector x that minimizes a linear (scalar product) function $f^T x$ subject to the linear constraints Ax≤b, where x is binary (i.e., x is a vector of 0 and 1 values only). In conventional linear programming, the Ax≤b inequalities can be made to include equality constraints (Aeq x=beq) and thus such constraints can even become the only constraints of interest for certain applications. In this case, to employ binary integer programming, the scalar product $f^T x$ may be used to include the various costs of the pairings of the $2^{nd}$-order factors—e.g., the upper numbers in the cells of the table of FIG. 35.

Thus, for our example (and with depth 4), the required quantization costs for all possible pairings are one more than (to include the sign bit) each number in this sequence: [9 6 6 4 5 8 6 3 2 4 6 6 5 4 4 4 5 6 5 4 4 6]. To correctly represent the total quantization cost, any unpaired zero-pair results in a $2^{nd}$-order factor with one non-trivial coefficient, as shown in equation (2), while any actual pairing yields a 4th-order factor with two non-trivial coefficients, as shown in equation (3), hence requiring twice the quantization cost. A quadratic cost weighting may be used, although linear, cubic, etc., could also be employed. These modifications lead to the cost vector: $f^T$=[100 98 98 50 72 81 98 32 18 50 49 98 72 50 50 25 72 98 72 25 25 49]. One or more entries of the cost vector may be related to one or more quantization costs among the pairing candidates.

For this example problem, the binary integer programming tool must find the binary vector x satisfying Ax=b, such that $f^T x$ is minimized, where A is given by equation (8), $f$ is given by the cost vector shown above, and where b is a length-7 vector in which each entry is "1." To avoid creating a bias that could possibly favor one potential pairing choice, an $x_o$ is used that leaves all zero pairs alone (i.e., if $x=x_o$, then no 2nd-order factors would be paired). Thus, for this example, $x_o$ is given as: $x_o$=[1 0 0 0 0 1 0 0 0 0 1 0 0 0 0 1 0 0 0 1 1 1$]^T$. Given that Table 1 provides a coarse quantization cost matrix (also illustrated in FIG. 8) to initiate this design, the static binary integer programming problem is modified into a dynamic version in which the cost vector is continually fine-tuned to represent the actual cost.

Figure 11:
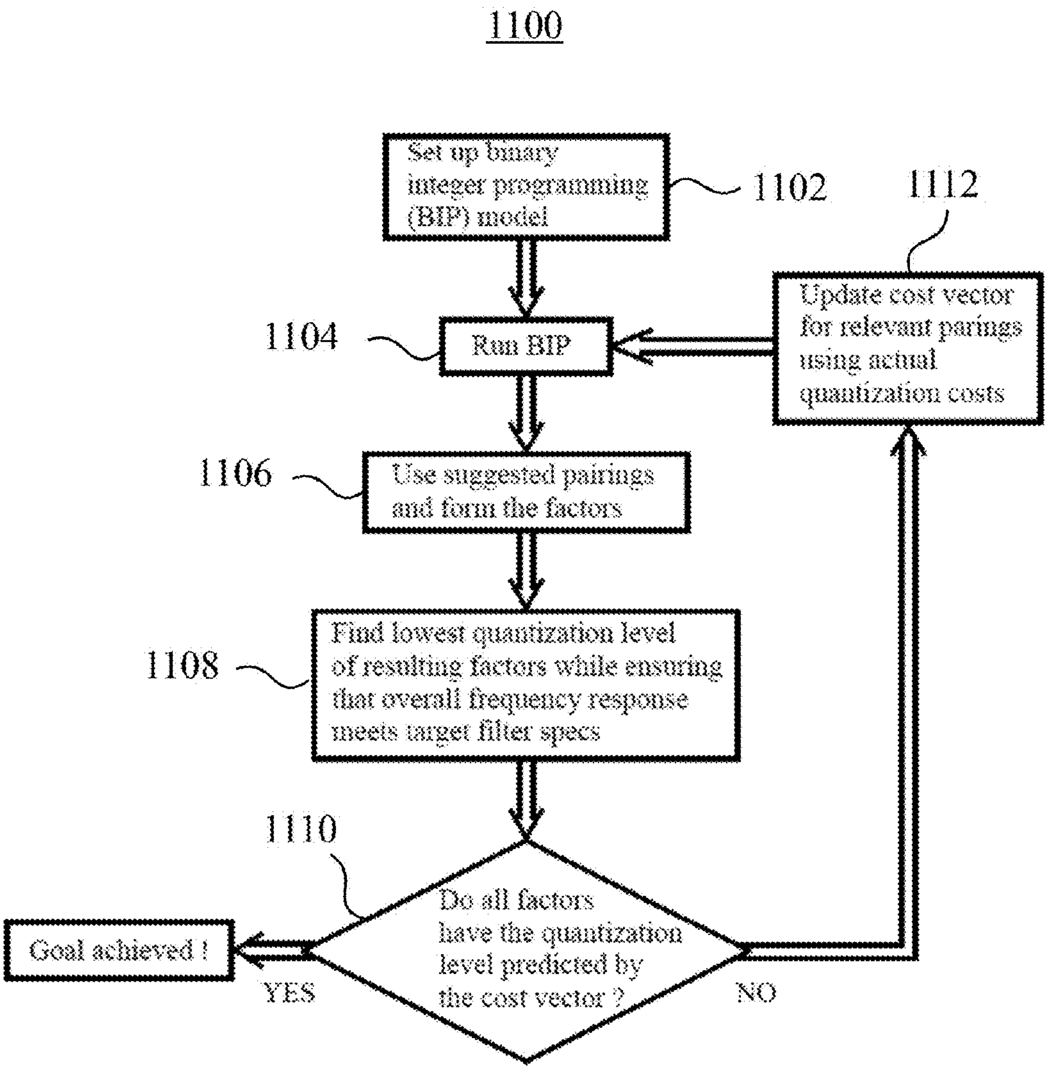
FIG. 11 depicts a flow chart illustrating an example method.

FIG. 11 illustrates a flowchart 1100 for using binary integer programming to help determine a lowest quantization cost for implementing a filter, according to an embodiment. The Binary Integer programming (BIP) model is set up at block 1102 as described, for example, in Section II. The BIP model is then executed at block 1104. At block 1106, suggested pairings are generated as discussed with reference to the tables in FIGS. 34 and 35. At block 1108, a lowest quantization level of the resulting factors is determined by solving, for example, for the binary vector x satisfying Ax=b, such that $f^T x$ is minimized.

At block 1110, a determination is made whether the current factors result in an actual quantization cost that is substantially the same as the predicted quantization cost determined in block 1108. If the actual quantization cost is substantially the same as the predicted quantization cost, then the method ends. However, if the actual quantization cost is not substantially the same as the predicted quantization cost, method 1100 proceeds to block 1112 where the cost vector x is updated using the actual quantization cost values. The loop then repeats starting at block 1104, until the actual quantization cost is substantially the same as the predicted quantization cost.

According to one embodiment, as a final step, to check for having perhaps reached a local optimum, one can launch the above-described dynamic pairing algorithm a second time using a different depth parameter. When comparing the resulting solutions, the ultimate solution may be chosen as the one with the lower quantization cost. It is also possible to run the algorithm with even more depth values.

When the algorithm is used on the order-15 (FIG. 1) example filter, the algorithm provides the same result as is presented in FIG. 3, according to an embodiment. It is also possible, for example, to include a pair of zeros having reciprocal real values within the realm of second-order factors that are subject to pairing into 4th-order factors. While the same algorithm can also be employed for filters having complex zeros that are off the unit circle—which, due to a desire for linear-phase filters, would naturally occur as groups of four zeros that obey conjugate-reciprocal requirements (as shown in FIG. 9) for zeros that produce pass-band ripples, it is often suitable to simply represent these zeros by their natural 4th-order factors that have the four zeros as roots. It may be useful to combine two such factors to make an 8th-order factor, or to combine such a 4th-order factor with another 4th-order factor that was created from four unit-circle zeros with the algorithm. Normally there is a relatively limited handful of such zeros for a sharp narrow-band low-pass filter and they may be manually paired with another 2nd-order or 4th-order factor.

IV. SCALING AND STAGE SEQUENCING

Figure 12:
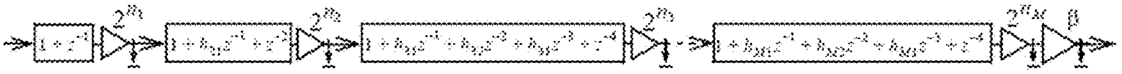
FIG. 12 depicts an example of an optimally-factored FIR filter.

To ensure a DC gain of unity for each stage in the sequence, a compensation multiplier is employed at the output of each stage, according to an embodiment. The value of this multiplier can be calculated by setting z=1 in equations (2), (3), (4), or (7), depending on the type of stage, (and getting its reciprocal). This is efficiently realized by approximating such stage multipliers by the nearest power-of-two, which may be built computation free using a hard-wired left-shift or right-shift of the data, according to an embodiment. To create the overall scale factor, a residual scaling by the value β is lumped into one post-filter compensation multiplier. FIG. 12 shows this resulting structure.

A practical optimally factored FIR filter may require careful factor-sequencing to efficiently manage the data-path word-length. The objective here includes finding a proper sequence for which the same suitably-small data-path word length N will suffice for all stages. To illustrate, consider a 60-tap filter example having a best 21 factors found using the algorithm described in Section III. Table 3 below lists these factors and the stages are initially sequenced (Stage #1 is first, . . . , Stage #21 is last).

TABLE 3

| 60 Tap Filter - Quantized stages of best identified paired factored sequence vs. CSD filter | | | |
|---|---|---|---|
| Best identified paired factors (direct factoring of the 60-tap filter) | | | |
| Quantized 18 stages | abs quantized (binary) non–trivial coeffs | Stage Mult. | 60-tap CSD filter Quantized coefficients |
| 1. $1 + z^{-1}$ | none | 0.5 | $h(0) = 2^{-8} - 2^{-13}$ |
| 2. $1 + z^{-2}$ | none | 0.5 | $h(1) = 2^{-8} - 2^{-11}$ |
| 3. $1 - 2.0374755859375z^{-1} + z^{-2}$ | 10.0000100110011 | −32 | $h(2) = 2^{-8} - 2^{-11} + 2^{-13}$ |

TABLE 3-continued

| 60 Tap Filter - Quantized stages of best identified paired factored sequence vs. CSD filter | | | |
|---|---|---|---|
| Best identified paired factors (direct factoring of the 60-tap filter) | | | |
| Quantized 18 stages | abs quantized (binary) non−trivial coeffs | Stage Mult. | 60-tap CSD filter Quantized coefficients |
| 4. $1 - 0.96484375z^{-1} - 0.46875z^{-2} -$ | [0.11110111 0.01111000] | −2 | $h(3) = 2^{-9} + 2^{-11} + 2^{-12}$ |
| $0.96484375z^{-3} + z^{-4}$ | | | $h(4) = 2^{-10}$ |
| 5. $1 - 1.8046875z^{-1} + z^{-2}$ | 1.1100111 | 4 | $h(5) = -2^{-9} - 2^{-13}$ |
| 6. $1 + 0.0546875z^{-1} - 1.21875z^{-2} +$ | [0.0000111 1.00111] | 1 | $h(6) = -2^{-7} + 2^{-11} + 2^{-13}$ |
| $0.0546875z^{-3} + z^{-4}$ | | | $h(7) = -2^{-6} + 2^{-9} - 2^{-11}$ |
| 7. $1 - 0.21875z^{-1} - 0.5z^{-2} -$ | [0.00111 none] | 1 | $h(8) = -2^{-6} - 2^{-7} + 2^{-11}$ |
| $0.21875z^{-3} + z^{-4}$ | | | $h(9) = -2^{-5} - 2^{-9} + 2^{-11}$ |
| 8. $1 - 0.8125z^{-1} + 0.75z^{-2} -$ | [0.1101 0.1100] | 1 | $h(10) = -2^{-4} + 2^{-6} + 2^{-8}$ |
| $0.8125z^{-3} + z^{-4}$ | | | $h(11) = -2^{-4} + 2^{-7} + 2^{-9}$ |
| 9. $1 + 0.125z^{-1} - 0.375z^{-2} +$ | [none 0.011] | 0.5 | $h(12) = -2^{-4} + 2^{-10} + 2^{-11}$ |
| $0.125z^{-3} + z^{-4}$ | | | $h(13) = -2^{-4} - 2^{-9} - 2^{-11}$ |
| 10. $1 - 0.015625z^{-1} + 0.21875z^{-2} -$ | [0.000001 0.001110] | 0.5 | $h(14) = -2^{-4} - 2^{-9} - 2^{-13}$ |
| $0.015625z^{-3} + z^{-4}$ | | | $h(15) = -2^{-4} + 2^{-7} - 2^{-9}$ |
| 11. $1 - 1.1875z^{-1} + z^{-2}$ | 1.0011 | 1 | $h(16) = -2^{-5} - 2^{-7} - 2^{-9}$ |
| 12. $1 + 0.71875z^{-1} + 0.25z^{-2} +$ | [0.10111 none] | 0.5 | $h(17) = -2^{-6} - 2^{-13}$ |
| $0.71875z^{-3} + z^{-4}$ | | | $h(18) = 2^{-6} + 2^{-8} - 2^{-12}$ |
| 13. $1 + 1.125z^{-1} + 0.375z^{-2} +$ | [1.001 0.011] | 0.25 | $h(19) = 2^{-4} + 2^{-9} - 2^{-12}$ |
| $1.125z^{-3} + z^{-4}$ | | | $h(20) = 2^{-3} - 2^{-7} + 2^{-11}$ |
| 14. $1 - 0.25z^{-1} + 1.75z^{-2} -$ | [none 1.11] | 0.25 | $h(21) = 2^{-3} + 2^{-4} - 2^{-7}$ |
| $0.25z^{-3} + z^{-4}$ | | | $h(22) = 2^{-2} - 2^{-8} - 2^{-10}$ |
| 15. $1 - 0.4375z^{-1} + z^{-2}$ | 0.0111 | 0.5 | $h(23) = 2^{-2} + 2^{-4} + 2^{-9}$ |
| 16. $1 - 0.21875z^{-1} + z^{-2}$ | 0.00111 | 0.5 | $h(24) = 2^{-1} - 2^{-3} + 2^{-7}$ |
| 17. $1 + 0.1875z^{-1} + z^{-2}$ | 0.0011 | 0.5 | $h(25) = 2^{-1} - 2^{-4} + 2^{-7}$ |
| 18. $1 + 0.625z^{-1} + z^{-2}$ | 0.101 | 0.5 | $h(26) = 2^{-1} + 2^{-9} - 2^{-12}$ |
| 19. $1 + z^{-1} + z^{-2}$ | none | 0.25 | $h(27) = 2^{-1} + 2^{-6} + 2^{-6} - 2^{-12}$ |
| 20. $1 + 1.90625z^{-1} + z^{-2}$ | 1.11101 | 0.25 | $h(28) = 2^{-1} + 2^{-4} + 2^{-6} + 2^{-13}$ |
| 21. $1 + 1.9921875z^{-1} + z^{-2}$ | 1.1111111 | 0.25 | $h(29) = 2^{-1} + 2^{-4} + 2^{-5} + 2^{-11}$ |
| Post-fill multi = 1.180419921875 | Post-fill multi = 1.0010111000110 | | Post-fill multi = 0.0010001111101 |

Figure 13:
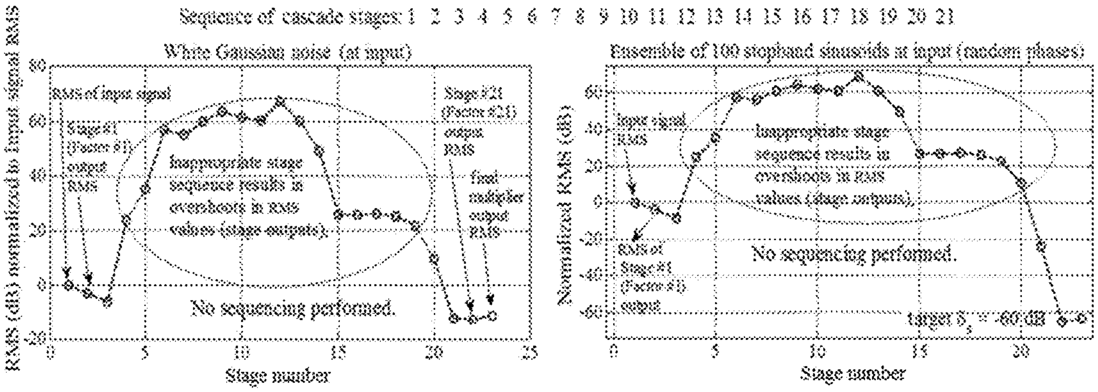
FIG. 13 depicts example RMS values for signals at the outputs of each stage for the optimally factored filter.

A "Four-Test Procedure," measuring the RMS value at each stage's output may be run on this data, according to an embodiment. The input RMS may be $2^{N\text{-}PAPR\_margin}$ in all four test cases. N is the word-length and setting PAPR_margin=2 accommodates an extremely high peak-to-average power ratio (PAPR) of 12 dB. (Alternatively PAPR_margin=1.5 supports 9-dB PAPR which can satisfy many applications.) FIG. 13 illustrates the resulting normalized RMS values for two different tests. The Four-Test Procedure involves the following four tests:

Test 1) The input signal is white Gaussian noise (uniform power across all frequencies). The filter is expected to attenuate by 60 dB the portion of the signal within the stop-band.

Test 2) The input signal is colored Gaussian noise with uniform power within the stop-band. It is a sum of 100 random phase sinusoids uniformly distributed across the stop-band. A 60 dB attenuation of the entire signal is expected.

Test 3) The input signal is one sinusoid at the pass-band edge.

Test 4) The input signal is one sinusoid at the stop-band edge.

The RMS results in FIG. 13 indicate high levels of overshoot (as high as 65 dB) for performing Tests 1 and 2 of the Four-Test Procedure, which would require very large bit-width for the data-path (as much as 10 or 11 extra bits) to avoid signal clipping. This illustrates why properly sequencing the stages, to manage and minimize the data-path word-length, is important.

Figure 14:
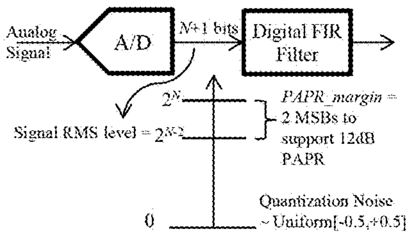
FIG. 14 depicts an example process of filtering a signal.

The simple M! trial-and-error approach for stage sequencing is impractical since each Four-Test Procedure would have to be reconfigured M! times. A more practical stage sequencing approach is needed. First, however, suppose a stop-band attenuation of $-20\log_{10}(\delta_s)$ dB is desired. FIG. 14 shows a situation where a post-A/D signal must have its out-of-band noise removed, according to an embodiment. The signal-to-quantization-noise ratio is given below in Equation (9).

$$SQNR_{filter\ input} = \frac{\text{Power(signal))}}{\text{Power}(quant\ \text{noise})} = \frac{(2^{N-PAPR\_margin})^2}{(0.5-(0.5))^2/12} = 12(2^{N-PAPR\_margin})^2 \tag{9}$$

$$\Rightarrow SQNR(\text{dB}) = 10\log_{10}\left(12(2^{N-PAPR\_margin})^2\right) = 6(N - \text{PAPR\_margin}) + 10.8$$

This is also the level of quantization noise that is injected by truncation at the output of each stage in FIG. 12. Given the target stop-band attenuation of $-20\log_{10}(\delta_s)$ dB it is important to reduce the overall effect of all stage quantization noise to a substantially negligible level compared to the stop-band attenuation. This indicates that we need a sufficiently large "margin" and that Equation (10) below satisfied:

$$\text{SQNR (dB)} \geq -20\log_{10}(\delta_s) + \text{margin (dB)} \tag{10}$$

With M optimal-factor stages and N+1 bits (including the sign bit) in the signal path, as in FIG. 12, and considering that the stage quantization noise sources are independent and identically distributed (iid), the required word-length is given by Equation (11):

$$SQNR(\text{dB}) \geq -20\log_{10}(\delta_s) + \text{margin}(\text{dB}) + 10\log_{10}(M) \Rightarrow N \geq \frac{-10.8 - 20\log_{10}(\delta_s) + \text{margin}(\text{dB}) + 10\log_{10}(M)}{6} + \text{PAPR\_margin} \quad (11)$$

Inequality (11) provides a useful relationship between the word-length N, the value of the margin, and the PAPR_margin. It may facilitate an iterative process to get the desired small (yet large enough) value of N. Thus Equation (11) indicates that for (−60 dB) and M=21 (e.g., Table 5), and using PAPR_margin=1.5, the signal path word-length (N), excluding sign bit, should be at least 13 bits to support a margin of at least 6 dB (to limit stop-band degradation) for a majority applications. Also, if the input x(t) to a linear system with an impulse response h(t) is stationary white noise with power P, then the output y(t) power can be described by Equation (12):

$$E[y^2(t)] = rms_y^2 = P\int_{-\infty}^{+\infty}|h(t)|^2 dt = P\int_{-\infty}^{+\infty}|H(f)|^2 df. \quad (12)$$

Figure 15:
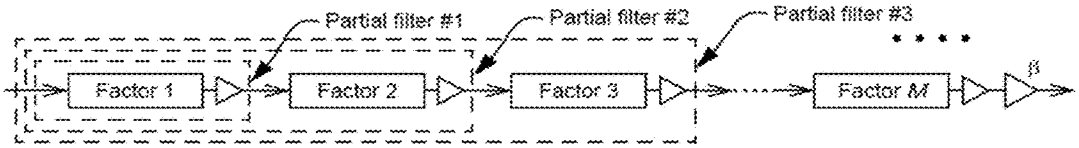
FIG. 15 depicts an example illustration of partial filters in sequence.

Equation (12) shows that, to minimize the increases in data-path RMS and dynamic range at the stage outputs, it is important to determine the specific sequence of stages that would minimize the sum of squared coefficient values for all partial filters—where partial filters are defined as in FIG. 15, according to an embodiment. This observation enables a simple sequential approach in sequencing the M optimal factors without the need to, each time, reconfigure the complete sequence for test. According to an embodiment, for the first position in the sequence, out of the M possible choices, choose the factor with the smallest sum-of-squared coefficient values (recall, all stages have approximately 0-dB DC gain). Next, for the second position, out of the M−1 remaining possible stages, choose the one that yields the smallest sum-of-squared coefficient values for the partial filter #2 as illustrated in FIG. 15. Then, for the third position, out of the M−2 remaining stages, choose the one that yields the smallest sum-of-squared coefficient values for the resulting partial filter #3 as illustrated in FIG. 15. This process is continued until the last stage in the sequence is reached, according to an embodiment. This entails a more practical complexity level of M+(M−1)+ . . . +2=M(M+1)/2−1, which is 230 for the example where M=21. The sequence of RMS values for Tests 1 and 2 are reported in FIG. 16 for the resulting sequence of optimal factors.

Figure 16:
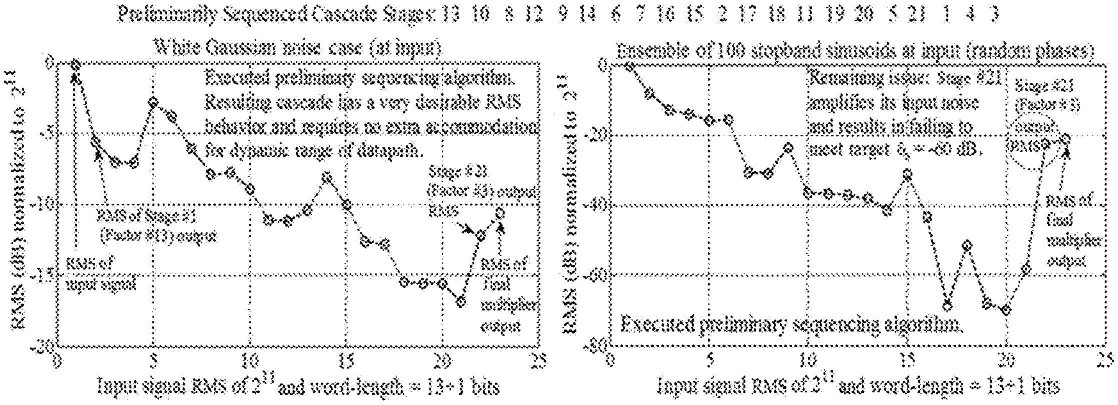
FIG. 16 depicts example RMS of signal at outputs of a sequence of stages of an FIR filter, according to an embodiment.

While, as shown in FIG. 16 (for the example of the 60-tap filter with 21 stages), this proposed initial sequencing method is very effective in mitigating and fully resolving the RMS inflation problem shown in FIG. 13; unfortunately, as one remaining draw-back, it also forces one of the factors with the largest sum-of-squared coefficient values to be the last stage (Factor #3 for this 60-tap filter example). This is also illustrated in FIG. 16, where the very last stage (Factor #3) excessively amplifies its input noise and the residual stop-band signal to an unacceptable level at its output (which is the filter's output) and hence, prevents the overall filter from achieving the target 60-dB stop-band attenuation.

To address this final issue, according to an embodiment, a simple modification of the preliminary sequencing result is adopted. The "worst factors" are identified in terms of the previously introduced metric. Table 4 shows factors with the largest sum-of-squared coefficient values when all factors are normalized to have a DC gain of 0 dB, according to an embodiment. A specific threshold for the largest sum-of-squared coefficient values may be used (e.g., threshold=4) to define the number of worst factors. Other worst factor (WF) settings could be used as well. Table 4 gives the features of the worst eight factors for the present example. The WF selected factors are then distributed at isolated fixed positions that spread across the sequence of optimal factors, according to an embodiment.

TABLE 4

Worst factors of the 60-tap filter example optimal factors

| | Worst Factors (top to bottom) among Table 5 stages (But when normalized to DC gain of 1, we have, for example $-26.68 + 54.37z^{-1} - 26.68z^{-2}$ for Factor #3) | Sum of squared coeffs. | Largest absolute value of coeffs. |
|---|---|---|---|
| 3. | $1 - 2.0374755859375z^{-1} + z^{-2}$ | 4379.9 | 54.37 |
| 5. | $1 - 1.8046875z^{-1} + z^{-2}$ | 137.8 | 9.24 |
| 4. | $1 - 0.96484375z^{-1} - 0.46875z^{-2} - 0.96484375z^{-3} + z^{-4}$ | 25.7 | 2.51 |
| 11. | $1 - 1.1875z^{-1} + z^{-2}$ | 5.2 | 1.46 |
| 6. | $1 + 0.0546875z^{-1} - 1.21875z^{-2} + 0.0546875z^{-3} + z^{-4}$ | 4.4 | 1.37 |
| 8. | $1 - 0.8125z^{-1} + 0.75z^{-2} - 0.8125z^{-3} + z^{-4}$ | 3.1 | 0.94 |
| 7. | $1 - 0.21875z^{-1} - 0.5z^{-2} - 0.21875z^{-3} + z^{-4}$ | 2.1 | 0.89 |
| 15. | $1 - 0.4375z^{-1} + z^{-2}$ | 0.9 | 0.64 |

Figure 17:
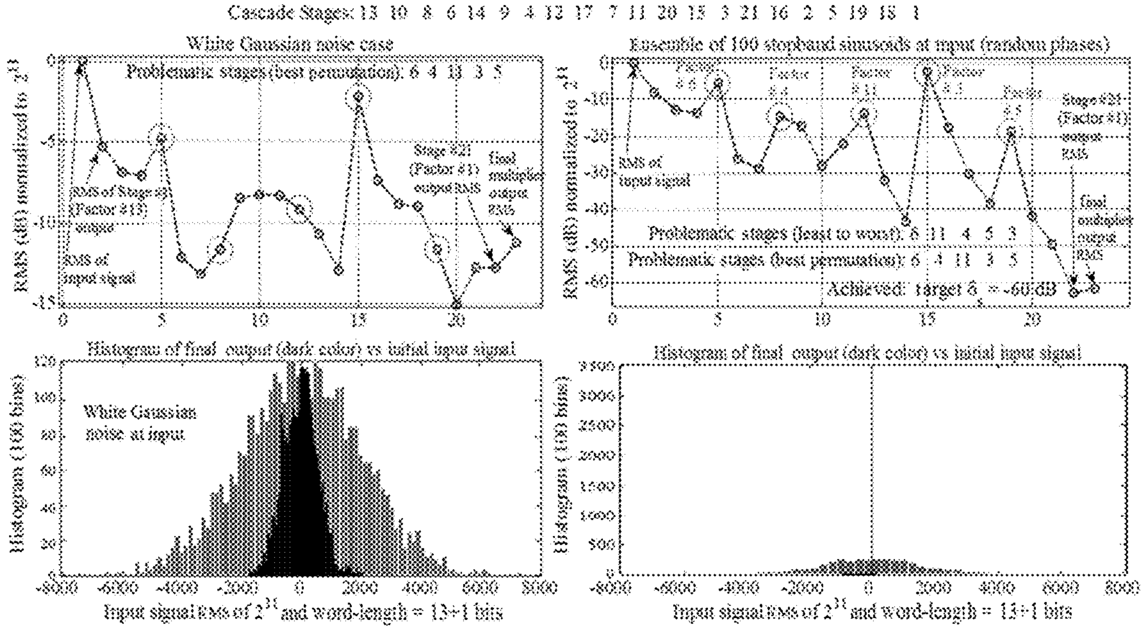
FIG. 17 depicts example RMS outputs of 60-tap filter stages, according to an embodiment.
Figure 18:
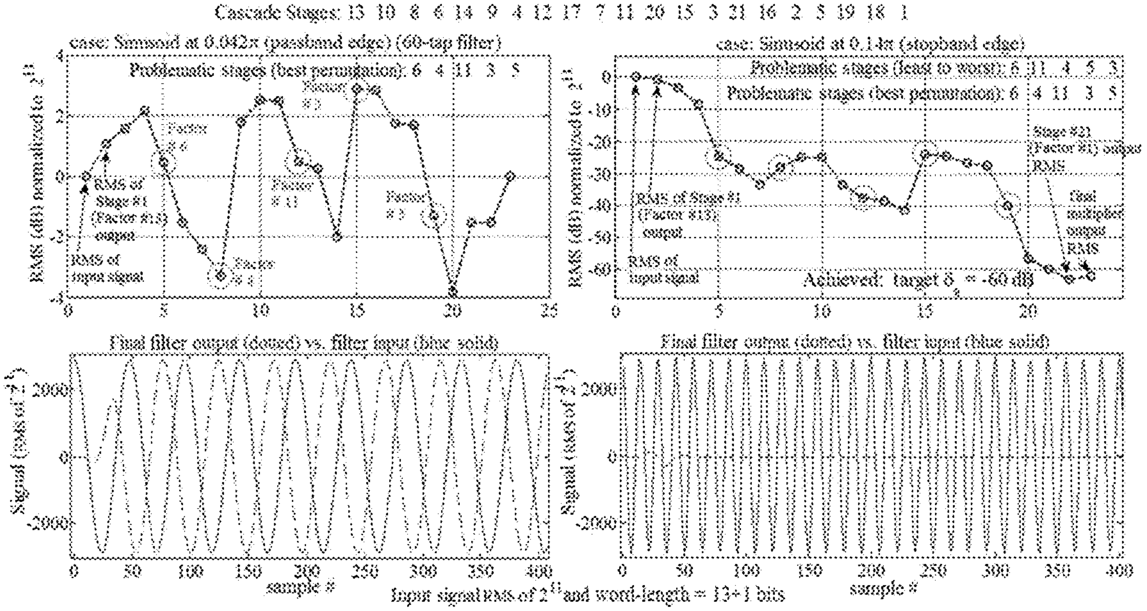
FIG. 18 depicts example RMS outputs of 60-tap filter stages, according to an embodiment.
Figure 19:
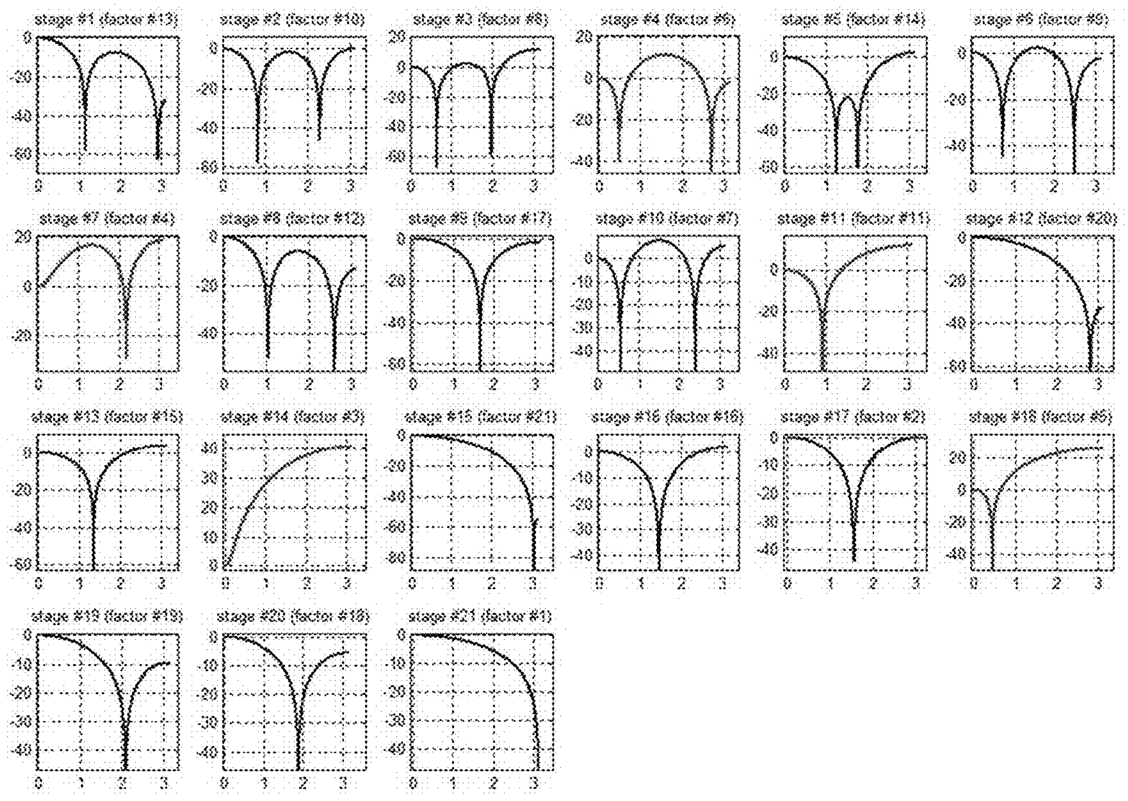
FIG. 19 depicts example frequency responses for all 21 stages of the 60-tap filter.

Next the above-described process is repeated, generating the sequence of partial filters illustrated in FIG. 15, once for each possible permutation of the WF selected worst factors, according to an embodiment. This final sequencing algorithm has a total complexity of: [M(M+1)/2−1](WF!)=16,200 for M=21-5. The resulting "best identified sequence" for the 60-tap filter example is: Stage Order=[13 10 8 6 14 9 4 12 17 7 11 20 15 3 21 16 2 5 19 18 1]. The results of the Four-Test Procedure are shown in FIG. 17 for Test 1 and 2 of the Four-Test Procedure, and in FIG. 18 for Tests 3 and 4 of the Four-Test Procedure, according to an embodiment. The five worst factors are circled to show their enforced positions in the sequence. The best permutation is [6 4 11 3 5] for these enforced positions in this example. Both FIG. 17 and FIG. 18 show that the "best identified sequence" is able to fully attenuate (by at least 60 dB) the stop-band portion of the input signal (including a sinusoid positioned at the edge of the stop-band) and it is able to pass the pass-band signal (including a sinusoid positioned at the edge of the pass-band) with negligible (less than 0.1 dB) attenuation. The frequency responses of all 21 stages, ordered according to the identified sequence are shown in FIG. 19.

Another example of checking the behavior of the designated stage sequence may be employed, to exhibit the effects of quantization noise caused by truncations at stage-outputs. Taking a smaller example, such as the order-15 filter illustrated in FIG. 3, the noise appearing at the output of the filter that is due to the truncation operation at the output of each of its five stages may be accounted for. Working from the output backwards, the first truncation encountered appears directly at the output, moreover, the next truncation, appearing directly at the output of Stage H5, is immediately connected to the filter output after being scaled by the output scaling factor β=7/8, according to an embodiment. For the other truncation-noise sources, those at the inputs of stages H2, H3, H4, and H5, the transfer functions may be defined as G1, . . . , G4 (via their impulse responses) as follows: $h_1$=[1 1]×0.5; $h_2$=[1 −0.3984375 −0.421875 −0.3984375 1]×1; $h_3$=[1 −0.75 1 −0.75 1]×0.5; $h_4$=[1 1 0.4375 1 1]×0.5; $h_5$=[1 −0.09375 1]×0.5. Note that performing a truncation is one method for signal datapath wordlength (bitwidth) management. Another method includes rounding instead of truncation.

Figure 20:
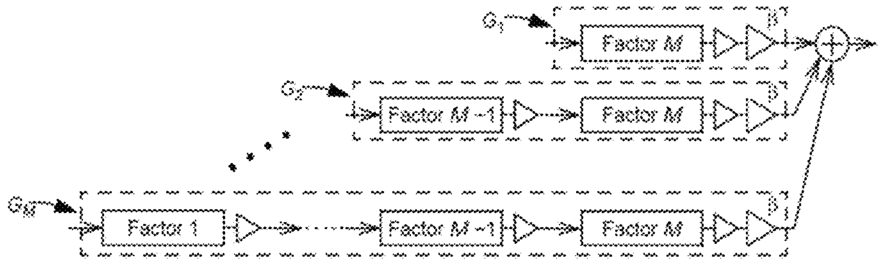
FIG. 20 depicts example factors for examining truncation noise effects at a filter output.
Figure 21:
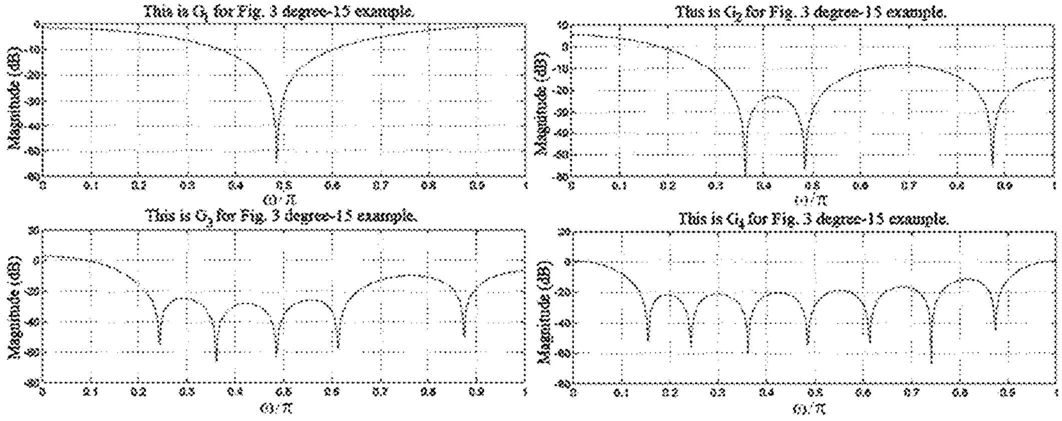
FIG. 21 depicts example magnitude plots of an FIR filter.

The G1, . . . , G4 partial-filters as illustrated in FIG. 20 are: $g_1=h_5\times\beta$; $g_2=\text{conv}(h_4, g_1)$; $g_3=\text{conv}(h_3, g_2)$; $g_4=\text{conv}(h_2, g_3)$, according to an embodiment. Example magnitude plots for these transfer functions are shown in FIG. 21. These G1, . . . , G4 partial-filters provide no significant amplification of their input quantization noise and hence demonstrate that the FIG. 3 stages would not require data-path word-length growth. In the instance when insufficient stop-band attenuation or pass-band "transparency" occurs one can also resort to a small increase in the data-path word-length (above the value N) just for the most troublesome stage(s).

V. EXTENSION OF OPTIMAL FACTORING ALGORITHM

The general problem of optimally pairing factors associated with unit-circle zeros, as discussed above, addresses the realization of a lower complexity optimally factored cascade structure. A closed-form expression approximating the total number of different choices of zero pairings for the case of M factors may be found as:

$$\begin{cases} \approx \dfrac{M!}{\sqrt{2^M}\left(\dfrac{M}{2}\right)!}\cosh\sqrt{M}, & \text{if } M \text{ is Even} \\ \approx \sqrt{M}\,\dfrac{(M-1)!}{\sqrt{2^{M-1}}\left(\dfrac{M-1}{2}\right)!}\sinh\sqrt{M-1}, & \text{if } M \text{ is Odd.} \end{cases} \tag{13}$$

Figure 22:
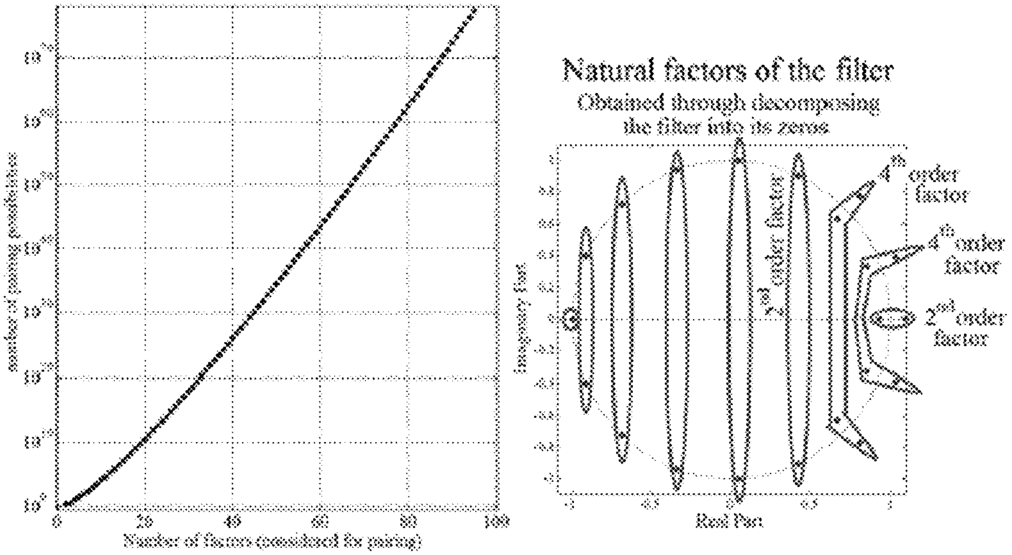
FIG. 22 depicts the complexity of a factors-pairing problem in an example filter.

FIG. 22 illustrates that an impractical order of complexity can result if an exhaustive examination of (all possible) zero-pairing combinations is attempted. For example, a filter with 45 natural factors (2nd- or 4th-order, corresponding to on- and off-unit-circle zeros) entails a total pairing complexity of approximately $10^{30}$). Also, for each pairing possibility, the resulting filter is formed and then the smallest coefficient quantization level for each resulting factor must be identified while satisfying the given filter specification, in order to benchmark the outcome versus other pairing possibilities. Hence, identifying the optimal factoring is a problem with an overall order of complexity that is approximately an order of magnitude higher than that which is indicated in equation (13) and FIG. 22 (due to the additional task of minimum-quantization level identification).

According to an embodiment, a recursive binary integer programming algorithm described here extends the algorithm described previously in Section III, in that the optimization process now includes (in addition to the 2nd-order factors employed before) all 4th-order factors formed from off-unit-circle zeros (in general, any remaining factors) usually those associated with a filter's pass-band ripples. The binary connection matrix A contains all feasible flow information required to find a binary flow vector x that will ultimately identify the optimal factors of the filter. The binary vector x has length K, where K is the total number of possible non-redundant flows (allowed pairings) for each factor that is considered in the algorithm. The size of binary matrix A is M×K where M is the number of factors that are obtained by decomposing the given filter. The vector x may be determined such that the cost function ($f^T$x) is minimized and is subject to the linear constraint Ax=b, where, the length-K vector b has all "1" elements and the elements of the length-K cost vector $f$ are estimated costs associated with the various quantization levels for each of the K allowed pairings (i.e., flows). In an embodiment, an 8th-order factor has twice, and four times, the cost of a 4th-order and a 2nd-order factor, respectively, at the same quantization level.

Having formulated the problem, the main challenges remaining are the defining of the coarse (initial) values of the quantization costs (elements of the vector $f$) and then the recursive updating of those costs with finer values, to deal with the nonlinear relationship between a factor's coefficient-quantization and the overall filter's magnitude response. According to an embodiment, the final outcome of the algorithm is the binary vector x that has M entries with value "1" (and the rest will be "0"), in a way that for each row of the M×K matrix A there is exactly one selected column that has a non-zero value on that row. Each column in this selection will represent a pairing of two factors, or it will represent the choice that a factor will remain unpaired.

To better explain the quantization cost associated with a 4th-order off-unit-circle factor, a sensitivity analysis with respect to its magnitude and angle is insightful. As mentioned, these zeros, typically associated with pass-band ripples, appear in reciprocal complex-conjugate groups of four (See FIG. 22), described by a 4th-order polynomial factor having the form:

$$\begin{aligned} H_k(z) &= (r_k e^{j\theta_k} - z^{-1})(r_k e^{-j\theta_k} - z^{-1}) \\ &\quad (r_k^{-1} e^{-j\theta_k} - z^{-1})(r_k^{-1} e^{j\theta_k} - z^{-1}) \\ &= 1 + z^{-4} - 2(r_k + r_k^{-1})\cos\theta_k(z^{-1} + z^{-3}) + \\ &\quad (r_k^2 + r_k^{-2} + 4\cos^2\theta_k)z^{-2} \end{aligned} \tag{14}$$

where $0 < r_k < 1$, and $0 < \theta_k < 180°$

Eq. (14) provides a first non-trivial coefficient of $-2(r_k+r_k^{-1})\cos\theta_k$ and a second non-trivial coefficient of $r_k^2+r_k^{-2}+4\cos^2\theta_k$. A suitable quantization level may be identified for the two non-trivial coefficients to employ the corresponding off-unit-circle 4th-order factor in the construction of an optimally factored filter. Otherwise the frequency-response deviation caused by the quantized factor's implementation could violate the overall target transfer-function specification. This deviation may be expressed in terms of either the Root Mean Square Error (RMSE) or the Mean Absolute Error (MAE). Here we employ the normalized MAE, as defined in Equation (15) where Num denotes the number of frequencies at which the functions are evaluated across the spectrum [0,2π]. For instance, MAE levels of −2 and −2.5 (in log terms) indicate normalized average error levels of 1% and 0.3% respectively for the quantized versus ideal magnitude response of the off-unit-circle factor.

$$MAE \text{ (in log terms)} = \log_{10}\left(\frac{1}{Num}\sum_{p-0}^{Num-1}\left|\frac{\left|H_k\left(e^{j\frac{2\pi p}{Num}}\right)\right| - \left|\hat{H}_k\left(e^{j\frac{2\pi p}{Num}}\right)\right|}{\left|H_k\left(e^{j\frac{2\pi p}{Num}}\right)\right|}\right|\right). \tag{15}$$

Where, $H_k\left(e^{j\frac{2\pi p}{Num}}\right) = 1 - 2(r_k + r_k^{-1})\cos\theta_k e^{-j\frac{2\pi p}{Num}} + (r_k^2 + r_k^{-2} + 4\cos^2\theta_k)e^{-j\frac{4\pi p}{Num}} - 2(r_k + r_k^{-1})\cos\theta_k e^{-j\frac{6\pi p}{Num}} + e^{-j\frac{8\pi p}{Num}}$.

and $$\hat{H}_k\left(e^{j\frac{2\pi p}{Num}}\right)$$

is the quantized version of $$H_k\left(e^{j\frac{2\pi p}{Num}}\right).$$

Figure 23:
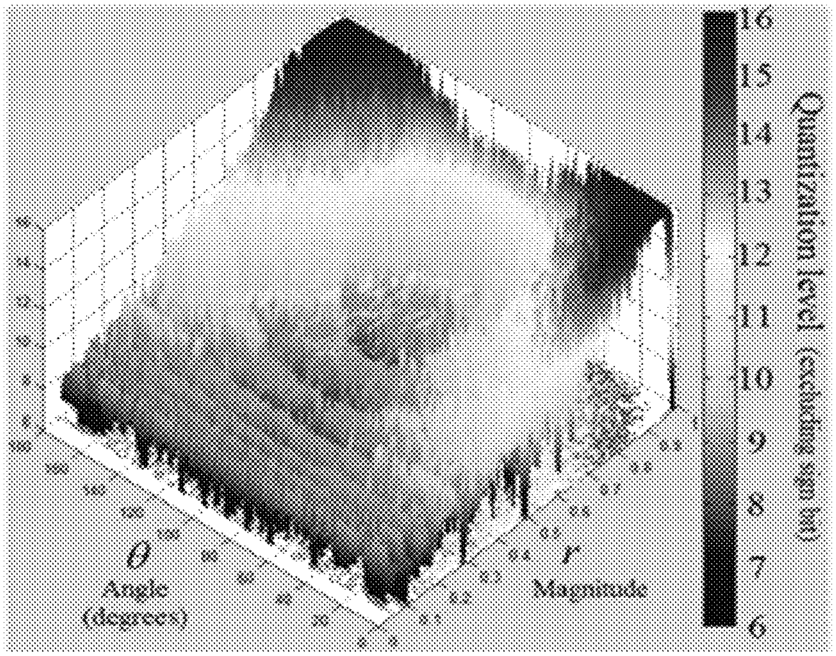
FIG. 23 depicts quantization level for a $4^{th}$ order factor of an example filter, according to an embodiment.

FIG. 23 illustrates the approximate (coarse) quantization levels (excluding sign-bit) as a function of Magnitude (specified to within 0.01 resolution) and Angle (specified to within 0.25°) for representing the first and second non-trivial coefficients, such that the normalized MAE from Equation (15) is limited to 0.3% (which represents a negligible level of normalized error), according to an embodiment. The plot illustrates several important general features:

(1) The plot is symmetric with respect to the angle of 90°.

(2) The regions having magnitude less than 0.6, independent of angle, and magnitude greater than 0.6 for angles between approximately 45° and 135° tend to provide low quantization-sensitivity results.

(3) The upper-right and lower-right corners (small angle or large angle and near-unity magnitude) tend to yield high quantization-sensitivity results.

Notice the very large quantization levels (16+1 bits or higher) required for the sensitive portion of the plot. FIG. 23 illustrates that a resulting factored filter could conceivably benefit considerably from the optimal pairing of an off-unit-circle zero group with another factor when zeros lying within the sensitive region of the plot are present.

The pairing of $4^{th}$ order factors may be repeated to identify the elements of the coarse (initial estimate) quantization cost vector $f$ associated with the pairing of each off-unit-circle zero group with other factors obtained from decomposing the target filter. This would complete the formulation of the binary programming problem and then we can solve for the vector x following the same procedure as discussed above in Section III, by using bintprog recursively in Matlab to iteratively update the cost vector with finer quantization cost values, according to an embodiment. Alternatively, we can start with unpaired factors (obtained from decomposing the filter) to try to determine the lowest quantization level for each factor, subject to the resulting filter meeting the target spec. It is then possible to use the outcomes as the initial coarse quantization costs (elements of vector $f$) for the pairing of the 4th-order factors with other factors, by scaling the costs for the three cases of 4th-order paired with 4th-order, or left alone, 4th-order paired with a 2nd-order, and a 2nd-order alone. The recursive binary programming process may then be employed as described earlier with the additional step of repeating the process a few times for a few cases of the cost scaling. The complete flowchart for the described extended optimal factoring methodology is shown in FIG. 24.

Figure 24:
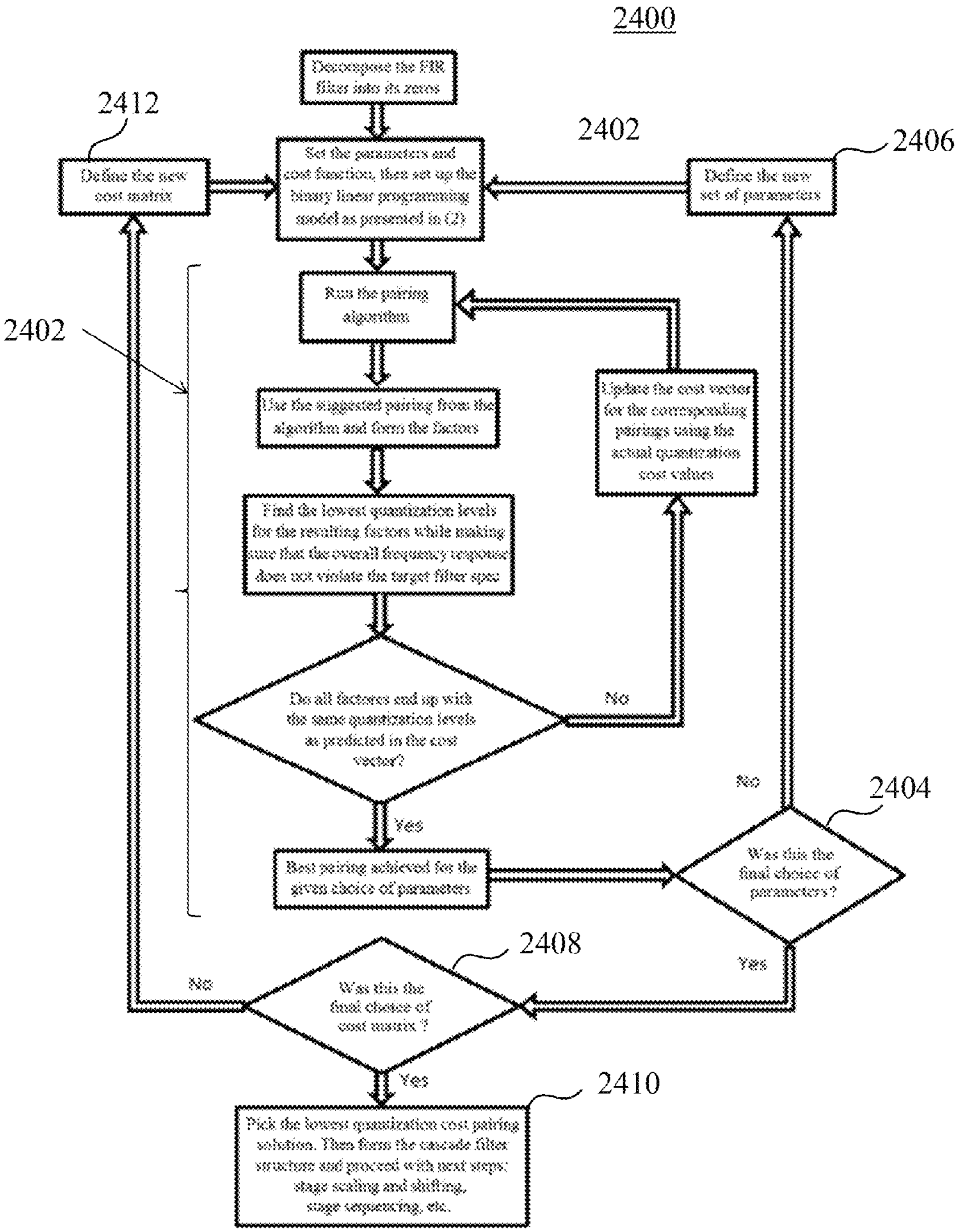
FIG. 24 depicts a flow chart illustrating an example factoring method.

FIG. 24 illustrates a method 2400 of determining optimal factors for a filter, which includes a series of steps 2402 associated with running a pairing algorithm, according to an embodiment. Steps 2402 are similar to those shown in FIG. 11 and described above in Section III. According to method 2400, once the best pairing has been achieved for the given parameters, step 2404 determines if this is the final choice of parameters to use. If not, then step 2406 defines a new set of parameters and re-runs the optimization process defined in steps 2402. If the user or program is done changing the parameters, then step 2408 determines if the cost matrix used is the final choice. If not, then a new cost matrix is defined in step 2412 and the optimization process defined in steps 2402 is re-run again. If, at step 2408, the final cost matrix is determined to have been used, then the lowest quantization cost pairings are used in step 2410. As noted in step 2410, the stages can then be scaled, sequenced, etc., to further optimize the functionality of the filter.

VI. ADDITIONAL TECHNIQUES AND BENEFITS

As illustrated in Table 4 (and also in FIG. 19), certain unpaired 2nd-order factors (e.g., Factor #3) can be difficult to deal with; hence it may be desirable to ensure that such a factor will always be paired with some other factor, according to an embodiment. One technique for doing this is to set to zero (or omit) the relevant column from matrix A (from Equation 8). For example, by removing column 11 from A in equation (8), a binary integer program will be forced to pair zero-pair #3 with one of: #2, #4, #5, #6, or #7. In the same way, a specific pairing may be excluded, to avoid creating an undesirable 4th-order factor, by setting to zero column 12 in equation (8) to ensure that zero-pair #3 will not be combined with zero-pair #4.

The optimal factoring algorithm provides the freedom to impose additional constraints that can rule out such results, and it will then find the best pairings for which such constraints are met, according to an embodiment. In addition to the equality constraint Ax=b, the binary integer programming tool can simultaneously accommodate a set of inequality constraints Cx≤d, for which C=I, i.e., C is the K×K identity matrix (K is the length of solution-vector x), and then, if the normal design is used (without such additional constraints) all elements of the vector d may be set to 1. That works because whatever "best solution" vector x one might determine via the Ax=b constraint, without introducing the Cx≤d constraint, that same "best x" will also satisfy Cx≤d because C=I, and x≤d will always hold, since x is a vector of 0 and 1 elements, while all elements of d have the value 1. But when certain undesirable pairings are wanted, certain elements of d are set to 0. For example, using the matrix A provided above in Equation (8), the matrix has seven rows corresponding to the seven factors of the filter. The five "1" elements in the first row indicate that Factor #1 is either left unpaired (the first element) or it is allowed to be paired according to either of the following factor pairings: (#1-#4), (#1-#5), (#1-#6) and (#1-#7). Suppose it is desired to ensure that Factor #1 and Factor #4 are never paired in the so-constrained optimal solution. Then we need only set the second element of the d vector to be 0, because then the Cx≤d constraint will ensure that the second element of the solution vector x will be 0, hence it will not have the value 1 when x is chosen to satisfy Ax=b, according to an embodiment. Thus, the solution vector x will not indicate (as the second column of A "offers") that Factors #1 and #4 should be paired together.

More generally, multiple columns of A may simultaneously be eliminated from consideration this way, by setting multiple (corresponding) elements of d to zero. In this regard, if we were to set only elements #2, #3, #4, and #5 of d to zero that would rule out the pairing of Factor #1 with any other factor.

This provides a way to improve the prospects of getting a good sequencing result, or it could even be viewed as a way to perhaps "give up" a little in terms of minimizing hardware and/or power consumption to get a sub-optimally factored cascade system with better noise characteristics through achieving a "more tamed" magnitude response for certain factors.

A variation on the above technique for blocking or ensuring certain pairings (while not involving directly the $Cx \le d$ inequality constraints), is to simply set to zero (or omit) the relevant column from the flow matrix A. For example, consider the above matrix A in Equation (8) for a filter with seven factors considered for potential pairing (each row represents one factor). By setting column #11 of A to zero (it contains the #3 unpaired choice), the optimal factoring algorithm will pair factor #3 with one of: #2, #4, #5, #6, or #7 (enabled by the remaining "1" elements in row #3). In the same way, a specific pairing may be excluded to avoid creating an undesirable 4th-order factor: Setting column #12 to all zeros will ensure that factor #3 will not be combined with factor #4.

Section III described embodiments for finding the "best" factoring of an FIR transfer function, however, one may also be interested in finding the second-best, third-best, . . . , etc., sets of optimal factors. According to an embodiment, in addition to the equality constraints $Ax=b$, that were used previously, the binary integer programming algorithm can simultaneously accommodate a set of inequality constraints $Cx \le d$, for which we now specify a C matrix and d vector. The original algorithm described in Section III may first be used to obtain the optimal factors. Next, the vector x representing that solution may be set as a length-K column-vector, which is renamed as $x_{old}$, according to an embodiment. Matrix C may then be defined to be the $1 \times K$ matrix whose single row is just $x_{old}^T$. Additionally, $M_{old}$ may be defined as the following non-negative integer: $M_{old}$=one less than the number of "1" elements in $x_{old}$, according to an embodiment. In this case, the $Cx \le d$ constraint may be included in a second running of the binary integer programming algorithm where the same A matrix and b vector is used, but we also include $Cx \le d$ with the above $1 \times K$ matrix being C and the above $M_{old}$ as the single component of the length-1 vector d, according to an embodiment. The $Cx \le d$ constraint imposes the requirement on the new solution vector x (for the second running of the binary integer programming algorithm) that it yield a different solution vector x (different than $x_{old}$). While $Ax=b$ holds, it follows that $x \ne x_{old}$ is equivalent to $Cx \le d$, which is the same as $(x_{old}, x) \le M_{old}$. This occurs for two reasons:

(1) for no binary vector x can the scalar product $(x_{old}, x)$ be greater than $M_{old}+1$ since there are exactly $M_{old}+1$ nonzero elements in $x_{old}$; and (2) this scalar product can be as large as $M_{old}+1$ only if $x=x_{old}$ Taking this concept one step further, the binary integer programming algorithm may be run over and over, each time creating an $x_{old1}$ and $M_{old1}$, then $x_{old2}$ and $M_{old2}$, $x_{old3}$ and $M_{old3}$, etc. New rows are then added to matrix C using $x_{old2}$, $x_{old3}$, . . . , and new elements to a growing column-vector d as shown below in Equation (13), where $N_{old}=M_{old}$:

$$C = \begin{bmatrix} X_{old\,1}^T \\ X_{old\,2}^T \\ X_{old\,3}^T \end{bmatrix} d = \begin{bmatrix} N_{old\,1} \\ N_{old\,2} \\ N_{old\,3} \end{bmatrix} \tag{13}$$

According to an embodiment, this procedure allows for the generation of a collection of "very good" sets of optimal factors, among which one may expect at least one to be attractive in regard to how well its factors scale and sequence—or, perhaps, to have other desirable properties.

Figure 25:
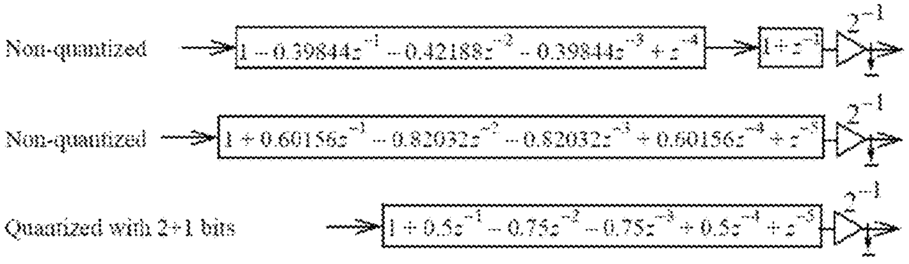
FIG. 25 depicts an example of stage insertion to reduce overall quantization cost.
Figure 26:
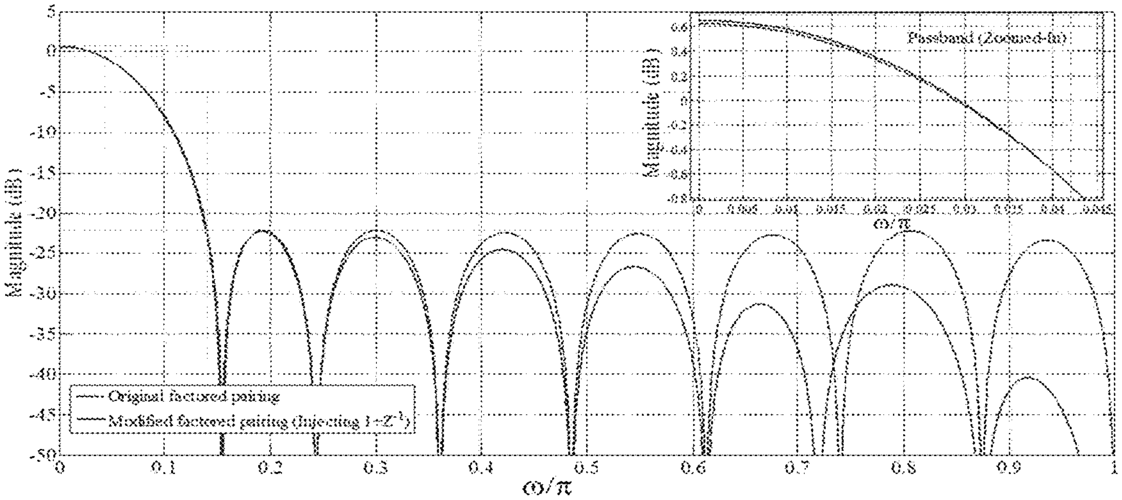
FIG. 26 depicts an example magnitude response of a modified optimally-factored FIR filter, according to an embodiment.

An example attractive property of the optimally factored structure is its capability to accommodate further combining of its stages, or the insertion of additional stages and the fusing of them with an existing stage in the structure without affecting any other stages. This may result in lower coefficient sensitivity, better overall frequency response, and better noise and stage performance, according to an embodiment. For example, filter complexity (in terms of quantization cost) may be reduced through the insertion of the new stage $(1+z^{-1})$ and then "fusing it" with the most expensive stage (the second stage) of the optimally-factored 16-tap example from FIG. 3. The convolution and new quantization from this example are illustrated in FIG. 25, and the better frequency response, in FIG. 26.

Figure 27:
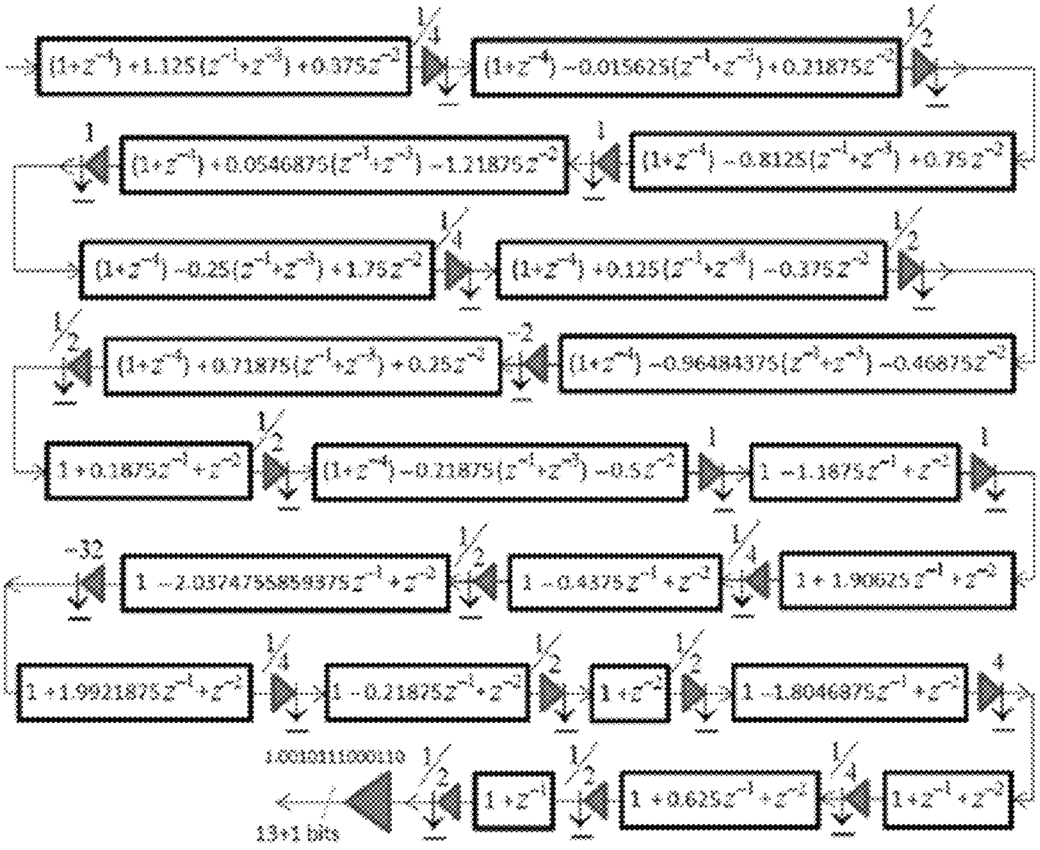
FIG. 27 depicts an example optimally factored filter, according to an embodiment.
Figure 28:
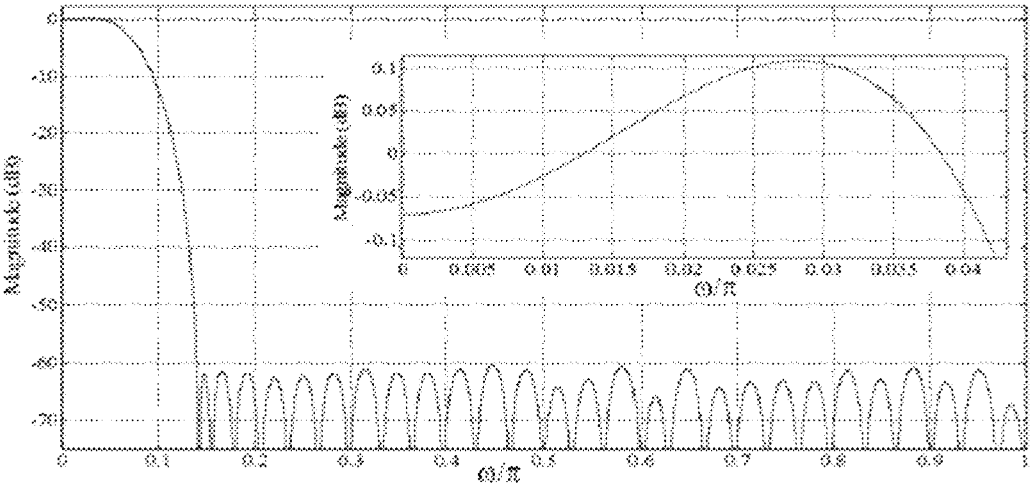
FIG. 28 depicts a magnitude plot of a filter, according to an embodiment.

In another example, an order 59 filter, such as the one illustrated in FIG. 27 having 21 total factors, may include fused factors where one has a costly coefficient (for example, a first factor having 15+1 bit quantization cost and a second factor having 6+1 bit quantization cost) to result in a new $4^{th}$ order factor having a lower hardware complexity in comparison with the total for the previous factors if they had been left separated. If the rest of the 19 factors remain intact, the resulting magnitude response for the (tamed) modified factored cascade, shown in FIG. 28, has a passband ripple that is limited to ±0.1085 dB and a stopband attenuation that is better than the required 60 dB specification. The resulting 4th-order factor has two non-trivial coefficients that require only (8+1)-bit quantization, compared to, for example, the (15+1) bit quantization of factor 1 and (6+1) bit quantization of factor 2.

The filter illustrated in FIG. 27 may be an optimally factored filter having a plurality of first stages where each stage within the plurality has an order of four or greater. Also, the filter includes one or more second stages each having an order less than four. A total order of the plurality of first stages may be higher than a total order of the one or more second stages.

Figure 29:
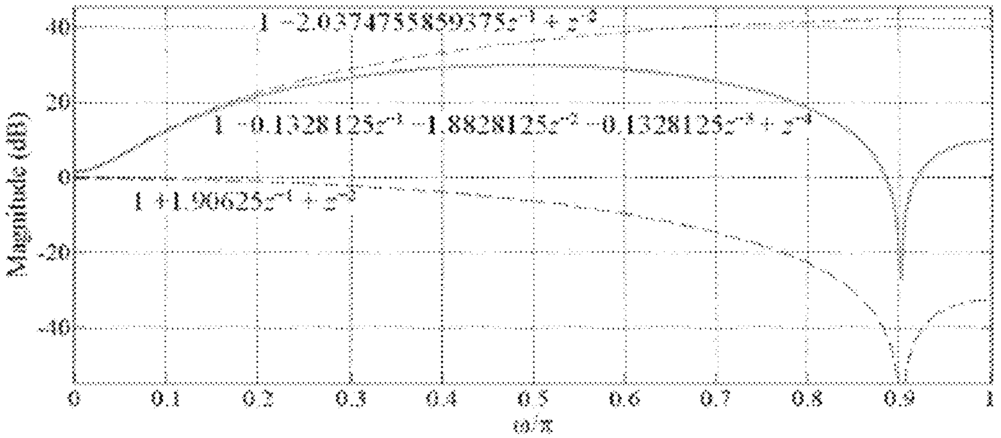
FIG. 29 depicts another magnitude plot of a filter, according to an embodiment.
Figure 30:
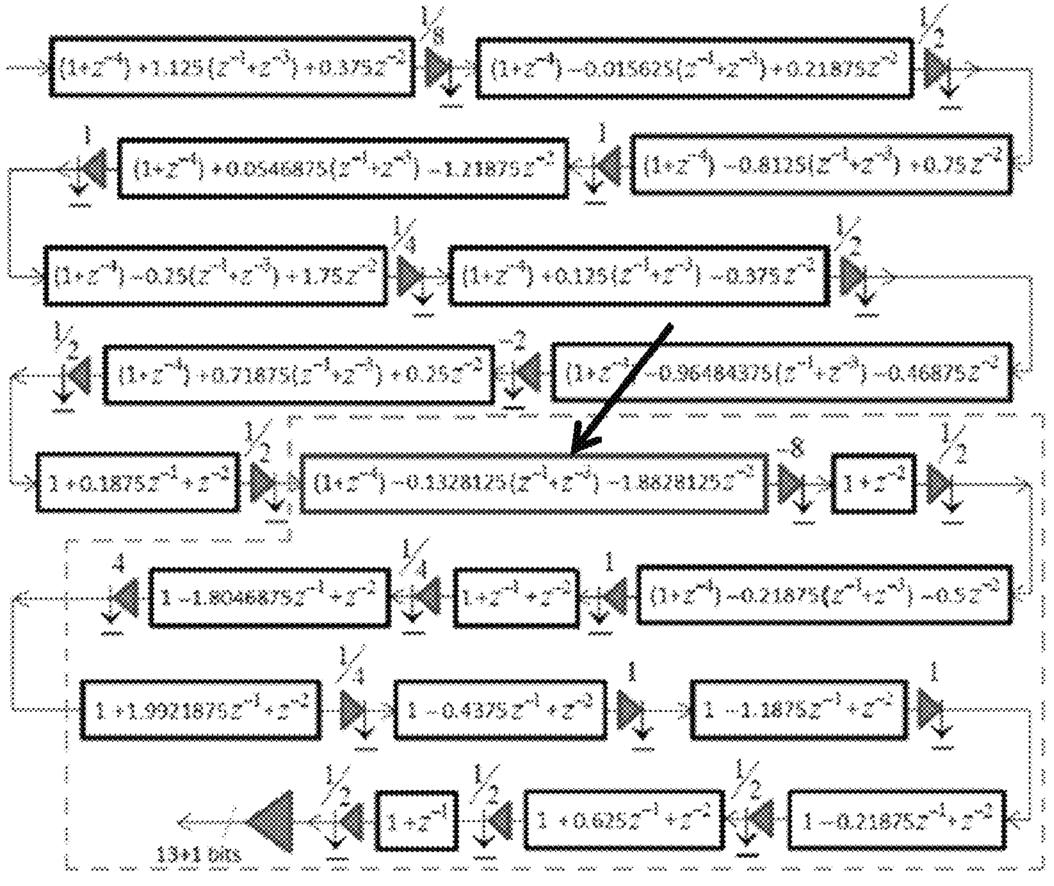
FIG. 30 depicts an example optimally factored filter with fused stages, according to an embodiment.

In this example, the number of shift-add operations needed to implement the resulting 4th-order factor is less than the non-fused case by three shift-adds. The magnitude response of the new 4th-order factor is plotted in FIG. 29 and it shows that the frequency domain behavior of the first factor (top dashed line) is considerably tamed (i.e., it has less out-of-band gain) when it is fused (convolved) with the second factor (bottom dashed line). Given that the fusion of the aforementioned factors results in the removal of two 2nd-order factors and the introduction of the new 4th-order factor, the total number of cascade factors is reduced by one. Thus, according to an embodiment, stage sequencing is performed again for the modified cascade. The sequencing algorithm described above in Section IV may be run again for the remaining 20 factors. The revised optimally factored structure is shown in FIG. 30. The new 4th-order factor is identified with the bold arrow. The dashed line indicates the portion of the cascade where the stage ordering has changed, compared to the original filter cascade illustrated in FIG. 27. Both partial and fully pipelined versions of the factored structure in FIG. 30 may be realized by inserting registers (buffers) before the stage inputs. This pipelining is yet one further benefit of the factored structure.

VII. EXAMPLE METHODS OF OPERATION

Figure 31:
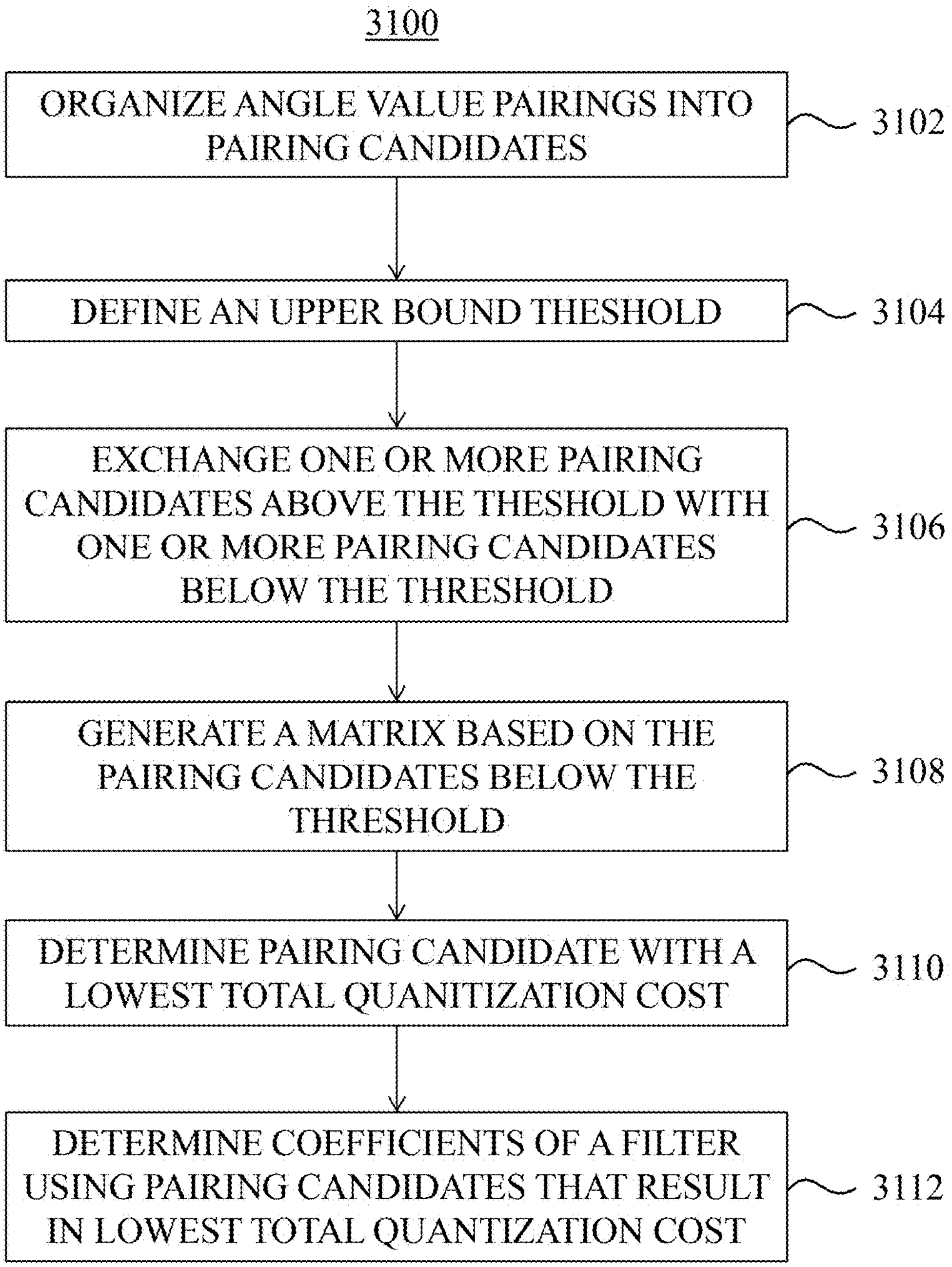
FIG. 31 depicts a flowchart of an example method.

FIG. 31 illustrates a method 3100, according to an embodiment. The method may be used to determine optimal coefficients of an FIR filter, IIR filter, digital filter, or analog filter. The method may be implemented in software and executed on a computing device, or implemented using hardware components.

Method 3100 begins at block 3102 where angle value pairings (e.g., $\theta_p$ and $\theta_q$) are organized into pairing candidates, according to an embodiment. An example of this organization is shown in the table of FIG. 34 as described above in Section III. The angle value pairings may be organized from a lowest quantization cost to a highest quantization cost, per pairing. In one example, the quantization cost for a given pairing of angle values is associated with a number of bits required to represent the given pairing of angle values within a stage of the filter. The number of bits may, or may not, include a sign bit.

Next, at block 3104, an upper threshold bound is defined, according to an embodiment. This may be the depth parameter discussed in Section III which determines the extent of the factors to be considered in the proceeding computations.

At block 3106, one or more pairing candidates above the threshold are exchanged with one or more pairing candidates below the threshold, according to an embodiment. An example of this re-organization is shown in the table of FIG. 35 as described above in Section III. A quantization cost of each of pairing candidate exchanged with another pairing candidate may be the same, according to an embodiment.

At block 3108, a matrix is generated based on the pairing candidates below the chosen threshold, according to an embodiment. An example matrix is provided as Matrix A as discussed above in Section III.

At block 3110, the pairing candidates within the matrix that result in a lowest total quantization cost are determined, according to an embodiment. This may be performed, for example, using binary integer programming and the process depicted in either FIG. 11 or FIG. 24. The binary integer programming algorithm may be used to determine a binary vector x that minimizes a linear cost function.

At block 3112, the pairing candidates that result in the lowest total quantization cost are used to determine the coefficients of an FIR, IIR, digital, or analog filter, according to an embodiment. If a given angle value pairing is represented by $\theta_p$ and $\theta_q$, then the first and second coefficients of the filter may be provided as $-2\cdot(\cos\theta_p+\cos\theta_q)$ and $2\cdot(1+2\cdot\cos\theta_p\cdot\cos\theta_q)$, respectively.

In an embodiment, blocks 3104 through 3112 are repeated with a different threshold determined in block 3106 during each iteration.

After all coefficients have been determined, the resulting cascaded filter may include stages with an order of four or higher, while including one or more other stages having an order less than four. In an embodiment, the total order of the stages having an order of four or higher is greater than a total order of the one or more stages having an order less than four.

Figure 32:
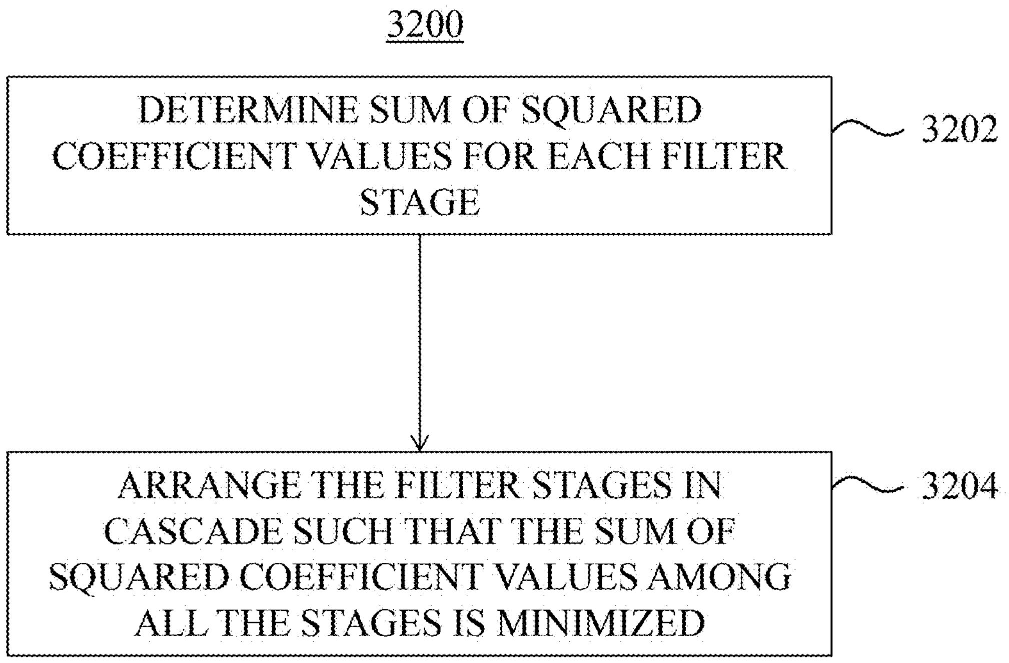
FIG. 32 depicts a flowchart of an example method.

FIG. 32 illustrates a method 3200, according to an embodiment. The method may be used to determine an optimal sequence for multiple stages of an FIR, IIR, digital, or analog filter. The method may be implemented in software and executed on a computing device, or implemented using hardware components.

Method 3200 begins at block 3202 where the sum of squared coefficient values are determined for each filter stage, according to an embodiment. This is described, generally, in Section IV. In one example, more than half of the stages each have an order of four or greater. In another example, a subset of the stages each have an order of four or greater, and the total order of the subset of the stages is greater than a total order of a remainder of the stages.

At block 3204, the filter stages are arranged in cascade such that the sum of squared coefficient values among all the stages is minimized, according to an embodiment. This is also described in Section IV. For example, for the first stage position in the sequence, out of the M possible choices, choose the stage with the smallest sum-of-squared coefficient values. Next, for the second position, out of the M−1 remaining possible stages, choose the one that yields the smallest sum-of-squared coefficient values for the partial filter #2 as illustrated in FIG. 15. Then, for the third position, out of the M−2 remaining stages, choose the one that yields the smallest sum-of-squared coefficient values for the resulting partial filter #3, and repeat this process for each of the stages until the sequence is complete, according to an embodiment.

In an embodiment, the distribution of stages occurring at block 3204 also includes identifying those stages with the highest sum of squared coefficient values and distributing those stages among the other stages in the cascade. In one example, those stages with the highest sum of squared coefficient values may be spaced apart equally from one another in the cascade.

VIII. EXEMPLARY COMPUTER SYSTEM

Figure 33:
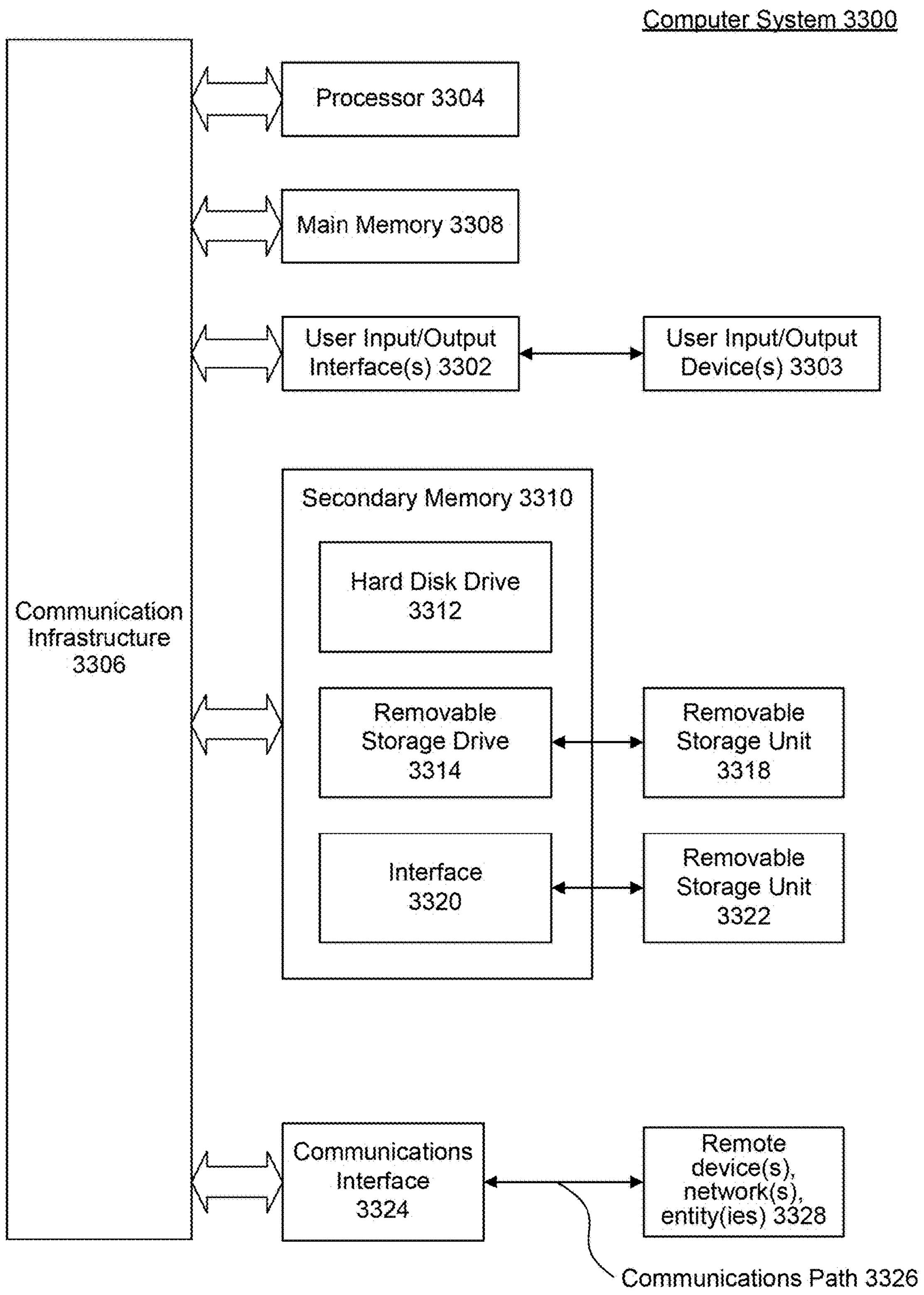
FIG. 33 depicts an exemplary computer system, according to embodiments of the present invention.

Embodiments of the invention may be implemented using hardware, programmable hardware (e.g., FGPA), software or a combination thereof and may be implemented in a computer system or other processing system. In fact, in one embodiment, the invention is directed toward a software and/or hardware embodiment in a computer system. An example computer system 3300 is shown in FIG. 33.

Computer system 3300 includes one or more processors (also called central processing units, or CPUs), such as a processor 3304. Processor 3304 is connected to a communication infrastructure or bus 3306. In one embodiment, processor 3304 represents a field programmable gate array (FPGA). In another example, processor 3304 is a digital signal processor (DSP).

One or more processors 3304 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 3300 also includes user input/output device(s) 3303, such as monitors, keyboards, pointing devices, etc., which communicate with communication infrastructure 3306 through user input/output interface(s) 3302.

Computer system 3300 also includes a main or primary memory 3308, such as random access memory (RAM). Main memory 3308 may include one or more levels of cache. Main memory 3308 has stored therein control logic (i.e., computer software) and/or data.

Computer system 3300 may also include one or more secondary storage devices or memory 3310. Secondary memory 3310 may include, for example, a hard disk drive 3312 and/or a removable storage device or drive 3314. Removable storage drive 3314 may be a floppy disk drive, a magnetic tape drive, a compact disc drive, an optical storage device, tape backup device, and/or any other storage device/drive.

Removable storage drive 3314 may interact with a removable storage unit 3318. Removable storage unit 3318 includes a computer usable or readable storage device having stored thereon computer software (control logic) and/or data. Removable storage unit 3318 may be a floppy disk, magnetic tape, compact disc, Digital Versatile Disc (DVD), optical storage disk, and/any other computer data storage device. Removable storage drive 3314 reads from and/or writes to removable storage unit 3318 in a well-known manner.

Secondary memory 3310 may include other means, instrumentalities, or approaches for allowing computer programs and/or other instructions and/or data to be accessed by computer system 3300. Such means, instrumentalities or other approaches may include, for example, a removable storage unit 3322 and an interface 3320. Examples of the removable storage unit 3322 and the interface 3320 may include a program cartridge and cartridge interface (such as that found in video game devices), a removable memory chip (such as an EPROM or PROM) and associated socket, a memory stick and universal serial bus (USB) port, a memory card and associated memory card slot, and/or any other removable storage unit and associated interface.

Computer system 3300 may further include a communication or network interface 3324. Communication interface 3324 enables computer system 3300 to communicate and interact with any combination of remote devices, remote networks, remote entities, etc. (individually and collectively referenced by reference number 3328). For example, communication interface 3324 may allow computer system 3300 to communicate with remote devices 3328 over communications path 3326, which may be wired and/or wireless, and which may include any combination of local area networks (LANs), wide area networks (WANs), the Internet, etc. Control logic and/or data may be transmitted to and from computer system 3300 via communication path 3326.

In an embodiment, a tangible apparatus or article of manufacture comprising a tangible computer useable or readable medium having control logic (software) stored thereon is also referred to herein as a computer program product or program storage device. This includes, but is not limited to, computer system 3300, main memory 3308, secondary memory 3310, and removable storage units 3318 and 3322, as well as tangible articles of manufacture embodying any combination of the foregoing. Such control logic, when executed by one or more data processing devices (such as computer system 3300), causes such data processing devices to operate as described herein.

In another embodiment, the invention is implemented primarily in hardware using, for example, hardware components such as application specific integrated circuits (ASICs), stand alone processors, and/or digital signal processors (DSPs). Implementation of the hardware state machine so as to perform the functions described herein will be apparent to persons skilled in the relevant art(s). In embodiments, the invention can exist as software operating on these hardware platforms.

In yet another embodiment, the invention is implemented using a combination of both hardware and software. Field-programmable gate arrays (FPGA) could, for example, support such an embodiment.

IX. CONCLUSION

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method of determining factors of an FIR filter, suitable for building the FIR filter as a cascade of factors, the method comprising:

factoring, using a processing device, the filter's transfer function into $1^{st}$ order and $2^{nd}$ order factors based on its natural zero-pairings;

creating, using the processing device, a collection of N angle values ($\theta_k$), where k=1, . . . , N, wherein each angle value corresponds to a $2^{nd}$ order factor of the filter's transfer function;

organizing, using the processing device, the pairings of N angle values into pairing candidates by creating a table with N rows and N columns, one row for each angle value ($\theta_k$), and one column for each angle value ($\theta_k$);

entering, using the processing device, an estimated quantization cost for each pairing candidate in the corresponding row/column position of the table;

reorganizing, using the processing device, the entries in each row of the table to have an increasing estimated quantization cost to produce a reorganized table, and entering in each row/column position of the reorganized table an identifier of the column that the estimated quantization cost came from in the table;

defining a threshold to indicate a number of columns of the reorganized table of estimated quantization costs to employ in the determination of the factors of the filter;

generating, using the processing device, a matrix based on a total number of pairing candidates found in each row of the reorganized table and each column of the reorganized table as defined by the threshold;

determining, using the processing device, a subset of pairing candidates in the matrix that provides a lowest predicted total quantization cost between all pairing candidates represented within the matrix;

using the subset of pairing candidates to determine, using the processing device, coefficients of the filter factors; and building the FIR filter having factors with the determined coefficients.

2. The method of claim 1, wherein a given pairing candidate is represented by θp and θq, and a first coefficient of a given factor of the filter is provided as $-2\cdot(\cos\theta p+\cos\theta q)$ while a second coefficient of the given factor of the filter is provided as $2\cdot(1+2\cdot\cos\theta p\cdot\cos\theta q)$.

3. The method of claim 1 wherein the quantization cost for a given pairing candidate is associated with a number of bits required to represent the angle values of the given paring candidate within a factor of the filter.

4. The method of claim 3, wherein the number of bits does not include a sign bit.

5. The method of claim 1, further comprising:

exchanging a first entry of the reorganized table from a column defined by the threshold with a second entry of the reorganized table from a column outside of the threshold, wherein a quantization cost of the first entry is the same as a quantization cost of the second entry.

6. The method of claim 1, wherein the determining comprises using Binary Integer Programming to determine a binary vector x that minimizes a linear cost function.

7. The method of claim 6, wherein the binary vector x is constrained by the inequality $Ax \leq b$, where A represents the matrix and b represents a vector consisting of 'p' values, where p is a positive real number.

8. The method of claim 7, wherein $p=1$.

9. The method of claim 6, wherein the linear cost function is represented by $f^T x$, where $f^T$ is a cost vector.

10. The method of claim 9, wherein one or more entries of the cost vector are related to one or more quantization costs among pairing candidates.

11. The method of claim 9, further comprising updating the entries of the cost vector in a feedback loop until the actual total quantization cost is substantially the same as the predicted total quantization cost.

12. The method of claim 1, wherein the natural zero-pairings comprise $4^{th}$ order factors.

13. The method of claim 1, further comprising:

after determining the coefficients of the filter factors for a given threshold, defining a different threshold to indicate another set of columns of the reorganized table of estimated quantization costs and repeat the generating, determining and using with the columns of the reorganized table defined by the different threshold.

* * * * *